(12) United States Patent
Kuwajima et al.

(10) Patent No.: US 7,068,474 B2
(45) Date of Patent: Jun. 27, 2006

(54) THIN FILM PIEZOELECTRIC ELEMENT; ACTUATOR, HEAD SUPPORT MECHANISM, AND DISC RECORDING AND REPRODUCING DEVICE USING THE THIN FILM PIEZOELECTRIC ELEMENT; AND METHOD OF MANUFACTURING THE THIN FILM PIEZOELECTRIC ELEMENT

(75) Inventors: Hideki Kuwajima, Kyoto (JP); Hirokazu Uchiyama, Osaka (JP); Yuko Ogawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 245 days.

(21) Appl. No.: 10/725,627

(22) Filed: Dec. 3, 2003

(65) Prior Publication Data

US 2004/0136117 A1 Jul. 15, 2004

(30) Foreign Application Priority Data

Dec. 3, 2002 (JP) ............................. 2002-351067
Jun. 27, 2003 (JP) ............................. 2003-184163

(51) Int. Cl.
*G11B 5/58* (2006.01)
*H01L 41/04* (2006.01)

(52) U.S. Cl. .................... 360/294.4; 310/330; 310/331
(58) Field of Classification Search ............... 360/294.4
See application file for complete search history.

(56) References Cited

U.S. PATENT DOCUMENTS 6,246,552 B1    6/2001  Soeno et al. ............. 360/294.4

| | | | |
|---|---|---|---|
| 6,570,297 B1* | 5/2003 | Takeuchi et al. | 310/328 |
| 6,667,844 B1* | 12/2003 | Yao et al. | 360/75 |
| 6,781,286 B1* | 8/2004 | Ogawa et al. | 310/333 |
| 6,863,383 B1* | 3/2005 | Takahashi | 347/72 |
| 6,912,760 B1* | 7/2005 | Uchiyama et al. | 29/25.35 |
| 2002/0190609 A1* | 12/2002 | Takeuchi et al. | 310/330 |
| 2003/0051322 A1* | 3/2003 | Gutierrez et al. | 29/25.35 |
| 2003/0173021 A1* | 9/2003 | Mikami et al. | 156/247 |

FOREIGN PATENT DOCUMENTS

| | | |
|---|---|---|
| EP | 1 202 273 | 5/2002 |
| EP | 1 298 735 | 4/2003 |
| JP | 8-88419 | 4/1996 |

(Continued)

OTHER PUBLICATIONS

H. Kuwajima et al., "Thin-Film Piezoelectric DSA for HDD", IEEE Transactions on Magnetics, IEEE Inc., New York, U.S., vol. 38, No. 5, Sep. 2002, pp. 2186-2188, XP001131574.

(Continued)

*Primary Examiner*—Jefferson Evans
(74) *Attorney, Agent, or Firm*—Wenderoth, Lind & Ponack, L.L.P.

(57) ABSTRACT

A first counter electrode and a second counter electrode, for electrically coupling a first piezoelectric element unit and a second piezoelectric element unit, for composing a thin film piezoelectric element are common floating electrodes. A first principal electrode film and a second principal electrode film of each piezoelectric element unit are connected, and a voltage is applied between the two piezoelectric element units. As a result, by the wiring of two terminals only without using grounding electrode wiring, the first piezoelectric element unit and second piezoelectric element unit can be driven, so that the wiring process may be substantially simplified.

15 Claims, 22 Drawing Sheets

FOREIGN PATENT DOCUMENTS

JP    2002-134807    5/2002
WO    02/35695      5/2002

OTHER PUBLICATIONS

H. Kuwajima et al., "Manufacturing Process of Piezoelectric Thin-Film Dual-Stage Actuator and Its Reliability of HDD," IEEE Transactions on Magnetics, IEEE Inc., New York, U.S., vol. 38, No. 5, Sep. 2002, pp. 2156-2158, XP001131567.

Y. Uematsu, "Switching to Super-High TPI and Piggy-Back Actuator", Idema Japan News, No. 32, pp. 4-7, International Disk Drive Association, (partial English translation).

* cited by examiner though described in this patent publication, a piezoelectric member in a laminated structure can be obtained.

THIN FILM PIEZOELECTRIC ELEMENT; ACTUATOR, HEAD SUPPORT MECHANISM, AND DISC RECORDING AND REPRODUCING DEVICE USING THE THIN FILM PIEZOELECTRIC ELEMENT; AND METHOD OF MANUFACTURING THE THIN FILM PIEZOELECTRIC ELEMENT

FIELD OF THE INVENTION

The present invention relates to a thin film piezoelectric element, its manufacturing method, and an actuator using the same.

BACKGROUND OF THE INVENTION

Along with recent progress in semiconductor technology, it has been attempted to realize a very small micro machine using semiconductor manufacturing technology, and actuators and other electromechanical elements have been developed. By using such elements, mechanical parts of small size and high precision can be realized, and the productivity can be dramatically improved by employing a semiconductor process. In particular, actuators employing piezoelectric elements are used for fine displacement of a scanning tunneling microscope and for fine positioning of a head slider of a magnetic recording and reproducing disk device (hereinafter called disk device).

For use in a disk device, for example, a piggyback actuator is developed as an actuator for positioning the magnetic head for recording at higher density (for example, Ultrahigh TPI and piggyback actuator, IDEMA Japan News No. 32, pp. 4–7, International Disk Drive Association; and Japanese Laid-open Patent Publication No. 2002-134807). In these examples, a magnetic head for recording and reproducing information on a magnetic disk is formed on a head slider, and the head slider is fitted to a flexure. This flexure is fitted to a suspension, and the suspension is fixed to an arm. In this configuration, the arm is oscillated by a voice coil motor (hereinafter called VCM), and the magnetic head is positioned on a predetermined track position on the disk, and moreover fine positioning is possible by using an actuator composed of a piezoelectric element.

FIG. 22 is a plan view of an example of a conventional piggyback actuator used in a disk device. FIG. 22 shows only the actuator region for fine positioning using a thin film piezoelectric element fitted to a flexure. FIG. 23 is a sectional view along line 23—23 of in FIG. 22. A thin film piezoelectric element 100 is composed of a pair of a first piezoelectric element unit 100A and a second piezoelectric element unit 100B. They are mirror symmetrical to each other, and adhered and fixed on a flexure 122. One end of the flexure 122 is affixed to a suspension 140. One end of the suspension 140 is affixed to an arm (not shown).

One of the first piezoelectric element unit 100A and second piezoelectric element unit 100B is displaced in a direction extending as indicated by arrow E, and the other is displaced in a direction contracting as indicated by arrow D, so that a slider holder 160 provided at the leading end is rotated finely. As a result, a head slider 101 fitted to the slider holder 160 is rotated finely, and a magnetic head 130 fitted to the leading end of the head slider 101 is moved finely as indicated by arrow C.

As shown in FIG. 23, the first piezoelectric element unit 100A and second piezoelectric element unit 100B each have a two-layer laminated structure of a first piezoelectric thin film 111A and second piezoelectric thin film 111B. The first piezoelectric thin film 111A is enclosed by a first electrode 112B and a second electrode 112A. Similarly, the second piezoelectric thin film 111B is enclosed by a third electrode 112C and fourth electrode 112D. The second electrode 112B and third electrode 112C are adhered by way of an adhesive layer 113, so that the entire structure is integrally fixed.

At the end of the first piezoelectric element unit 100A and second piezoelectric element unit 100B, via holes 114, 115 and wiring connections 116, 117 are provided for forming electrode terminals. The via holes 114, 115 are used for forming the wiring connections 116, 117 for short-circuiting the second electrode 112B and third electrode 112C. A terminal wire 118 is connected to the wiring connections 116, 117, and this terminal wire 118 is connected to a grounding electrode 119.

On the other hand, a terminal wire 120 is connected to the first electrode 112A and fourth electrode 112D of the first piezoelectric element unit 100A, and this terminal wire 120 is connected to a driving power source 121A. Thus, a specified voltage can be applied to the first piezoelectric element unit 100A. A terminal wire 120 is connected to the first electrode 112A and fourth electrode 112D of the second piezoelectric element unit 100B, and this terminal wire 120 is connected to a driving power source 121B. Thus, a specified voltage can be applied to the second piezoelectric element unit 100B.

The first piezoelectric element unit 100A and second piezoelectric element unit 100B are adhered and fixed on a flexure 122.

To realize such actuator for fine positioning, it is important to develop a thin film piezoelectric element small in size, light in weight, and large in displacement at low voltage. However, the thin film piezoelectric element is complicated to manufacture and is relatively expensive. It is hence demanded to decrease the number of wirings of the thin film piezoelectric element, facilitate the assembling, and simplify the manufacturing process.

In the prior art, however, such demand could not be satisfied. That is, as the wiring for the thin film piezoelectric element 100, connection from the first piezoelectric element unit 100A and second piezoelectric element unit 100B to the grounding electrode 119 as a common electrode is necessary, and the number of wirings on the flexure 122 increases. For this purpose, connection parts are needed, and it was difficult to simplify the process. In the first piezoelectric element unit 100A and second piezoelectric element unit 100B, the process for forming the via holes 114, 115 and wiring connections 116, 117 is needed, which lowered not only the manufacturing yield but also the reliability as the actuator.

An actuator in a laminated structure of piezoelectric thin film is disclosed, for example, in Japanese Laid-open Patent No. H8-88419. In this example, on a single crystal substrate of magnesium oxide (MgO), strontium titanate ($SrTiO_3$) or sapphire ($Al_2O_3$), an electrode layer of platinum (Pt), aluminum (Al), gold (Au), or silver (Ag) is formed, together with a piezoelectric layer made of piezoelectric material such as lead zirconate titanate (PZT) or lead lanthanum zirconate titanate (PLZT), and an electrode layer of similar material, and a junction layer composed of glass or silicon is formed on these films, and thereby a piezoelectric member is fabricated. By repeating the process of mutually bonding piezoelectric members by way of a junction layer by anodic bonding, the process of forming a junction layer on an electrode layer exposed by removing the substrate at the laminating side by polishing, and the process of bonding this bonded layer and a bonded layer of another piezoelectric member in the same procedure and removing the substrate again, a laminated body laminated in plural layers is formed. Finally, by taking out the inner layer electrodes in the laminated body mutually from both sides, a laminated actuator is realized. In this manufacturing method, the substrate is removed by etching process after polishing so that residual portion may not be formed, and as the mutual bonding method of piezoelectric members, not limited to anodic bonding, surface activated bonding and adhesive bonding are also disclosed.

In this disclosed example, however, an external electrode is formed from two sides of a laminated body of multiple layers of piezoelectric members by way of an insulating layer, and at least this external electrode must be formed on each one of the laminated bodies, and mass productivity is not satisfied. In this configuration, yet, since a displacement is caused in the direction perpendicular to the substrate surface, it is not suited to a structure used, for example, as an actuator for fine positioning of a head slider of a disk device.

SUMMARY OF THE INVENTION

It is hence an object of the invention to present a thin film piezoelectric element having a simple wiring structure and simplified manufacturing process, as an actuator for fine positioning, and its manufacturing method and an actuator using the same.

A thin film piezoelectric element of the invention comprises:
 a pair of piezoelectric element units formed of a first piezoelectric element unit and a second piezoelectric element unit,
 wherein the first piezoelectric element unit includes a first structure, and the second piezoelectric element unit includes a second structure identical to the first structure,
 wherein the first structure includes a first piezoelectric thin film enclosed between a first principal electrode film and a first counter electrode film, and a second piezoelectric thin film enclosed between a second principal electrode film and a second counter electrode film,
 wherein the first counter electrode film and the second counter electrode film are bonded facing each other via an adhesive layer,
 wherein the first structure and the second structure are disposed on substantially a same plane,
 wherein a bonding-region is formed between the first structure and the second structure, with the first counter electrode film and the second counter electrode film partially bonded to each other, and
 wherein the first piezoelectric element unit and the second piezoelectric element unit each have a wiring connection part for connecting the first principal electrode film and the second principal electrode film.

This configuration allows for displacement in a direction parallel to the substrate surface and to be driven by only two terminals.

DETAILED DESCRIPTION OF THE EXEMPLARY EMBODIMENTS

Figure 1:
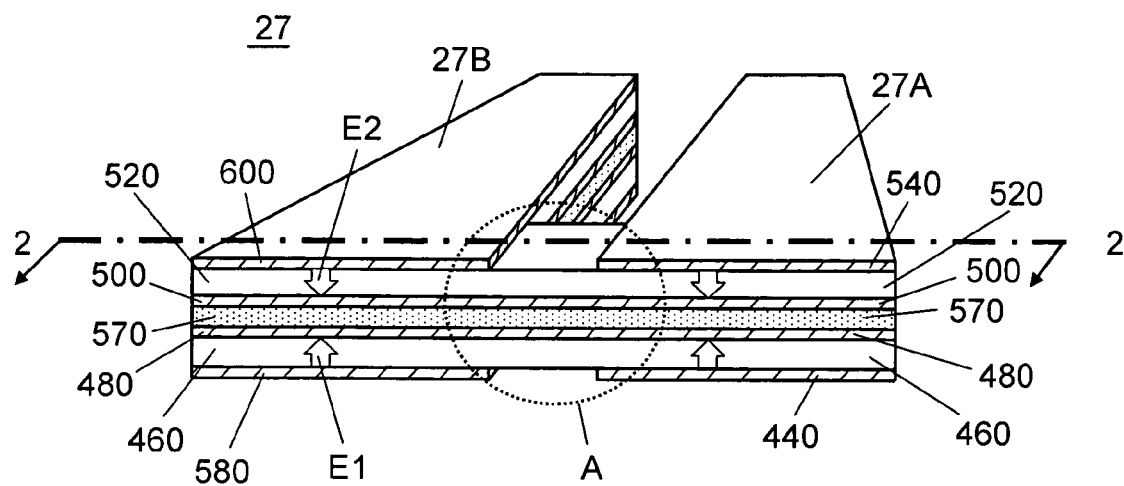
FIG. 1 is a perspective view showing a configuration of a thin film piezoelectric element in a first exemplary embodiment of the invention.

Referring now to the drawings, exemplary embodiments of the invention are specifically described below. In the drawings, like elements are identified with like reference numerals.

First Exemplary Embodiment

Figure 2:
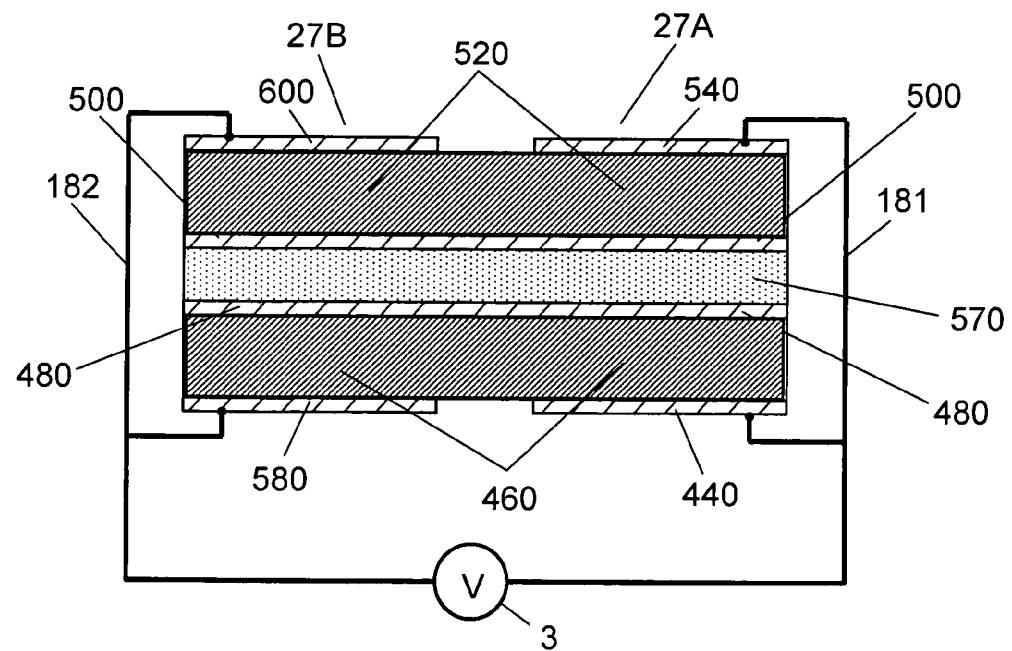
FIG. 2 is a sectional view of the thin film piezoelectric element of the first exemplary embodiment, along line 2—2 of FIG. 1.

FIG. 1 is a perspective view showing a configuration of thin film piezoelectric element 27 in a first exemplary embodiment of the invention, and FIG. 2 is a sectional view along line 2—2 of FIG. 1.

The thin film piezoelectric element 27 of the first exemplary embodiment is composed of a pair of piezoelectric element units. That is, a first piezoelectric element unit 27A and a second piezoelectric element unit 27B are coupled together in part, and are mutually mirror symmetrical.

The first piezoelectric element unit 27A is composed by laminating a first piezoelectric thin film 460 and a second piezoelectric thin film 520. A first counter electrode film 480 and a first principal electrode film 440 are formed on the top and bottom of the first piezoelectric thin film 460. A second principal electrode film 540 and a second counter electrode film 500 are formed on the top and bottom of the second piezoelectric thin film 520. The first counter electrode film 480 and second counter electrode film 500 are bonded together by way of an adhesive layer 570.

On the other hand, the second piezoelectric element unit 27B is composed by laminating a first piezoelectric thin film 460 and a second piezoelectric thin film 520. A first counter electrode film 480 and a first principal electrode film 580 are formed on the top and bottom of the first piezoelectric thin film 460. A second principal electrode film 600 and a second counter electrode film 500 are formed on the top and bottom of the second piezoelectric thin film 520. The first counter electrode film 480 and second counter electrode film 500 are bonded together by way of an adhesive layer 570. The adhesive layer 570 may be a conductive adhesive layer.

In this exemplary embodiment, the first piezoelectric element unit 27A and the second piezoelectric element unit 27B are integrally coupled in a bonding region A. In the bonding-region A, therefore, the first piezoelectric thin film 460, second piezoelectric thin film 520, first counter electrode film 480, second counter electrode film 500, and adhesive layer 570 are integrally coupled and formed. By the first piezoelectric element unit 27A and the second piezoelectric element unit 27B, the thin film piezoelectric element 27 is composed, and the entire structure is covered with a flexible coating resin (not shown). The first piezoelectric thin film 460 and second piezoelectric thin film 520 composed of the same material are polarized in the arrow E1 direction and the arrow E2 direction, respectively.

FIG. 2 is a sectional view along line 2—2 of FIG. 1, and specifically shows a configuration of a wiring connection part for driving the thin film piezoelectric element 27. The first principal electrode film 440 and second principal electrode film 540 for composing the first piezoelectric element unit 27A are connected by a wiring connection part 181. The first principal electrode film 580 and second principal electrode film 600 for composing the second piezoelectric element unit 27B are connected by a wiring connection part 182. The wiring connection parts 181, 182 are connected to a driving power source 3.

Figure 3:
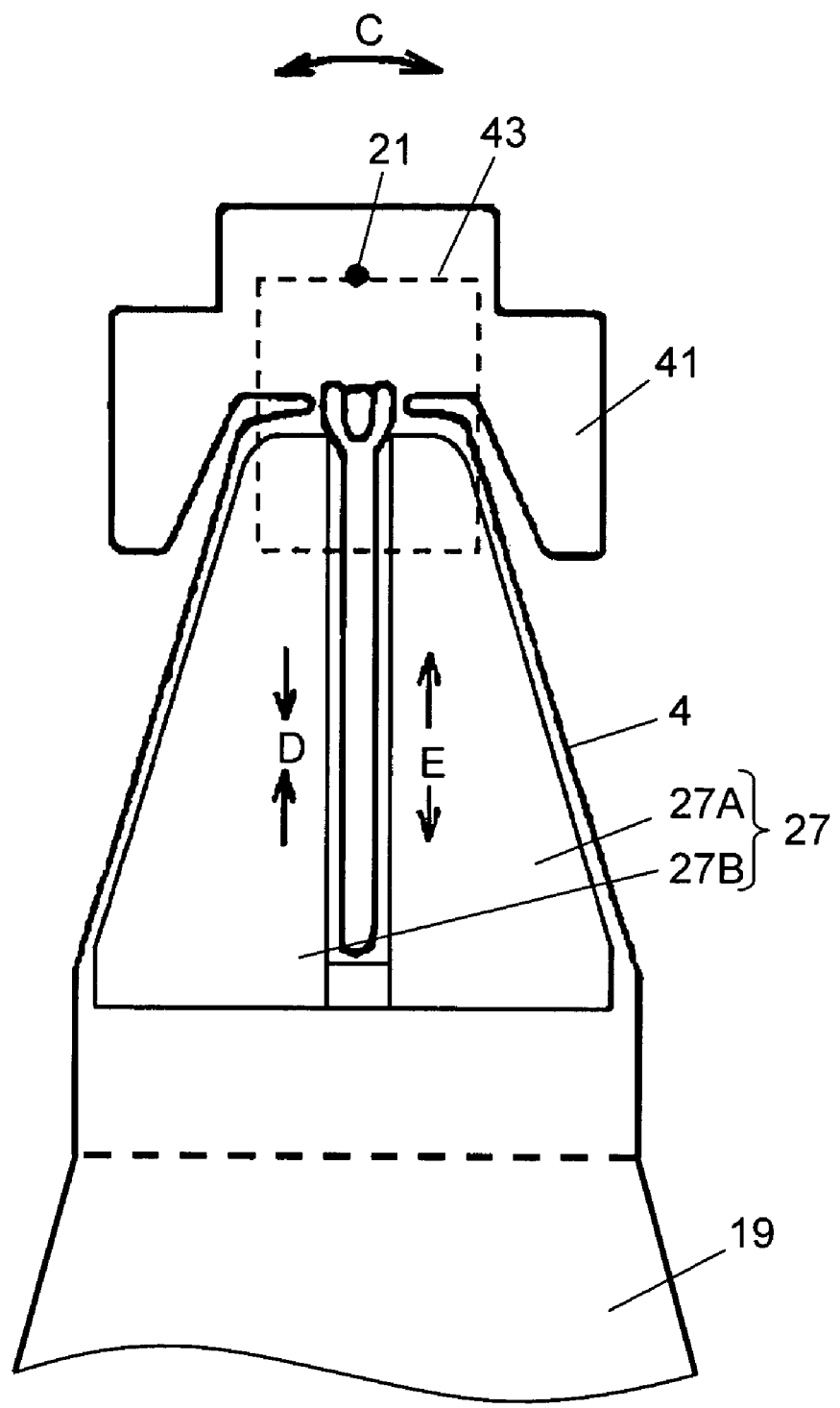
FIG. 3 is a plan view of the thin film piezoelectric element of the first exemplary embodiment showing a configuration when used as an actuator.

Using this thin film piezoelectric element 27, an actuator for fine positioning of a magnetic head of a disk device, for example, is composed as shown in FIG. 3. FIG. 3 is a plan view showing a mounting region of the thin film piezoelectric element 27 on a flexure 4 which is a holding substrate. A slider holder 41 is provided at the leading end of the flexure 4. On this slider holder 41, a head slider 43 mounting a magnetic head 21 is movably supported by an actuator 26. The head slider 43 is supported at the same side where the thin film piezoelectric element 27 is adhered and fixed, but not on the same plane, and it is disposed much closer than the thin film piezoelectric element 27 by reference to the disk (not shown).

The thin film piezoelectric element 27 is composed of a pair of the first piezoelectric element unit 27A and the second piezoelectric element unit 27B. They are mirror symmetrical in structure, and adhered and fixed on the flexure 4. One end of the flexure 4 is fixed to a suspension 19, and the suspension 19 is fixed to an arm (not shown). On the flexure 4, an electrode wiring for driving the signal from a magnetic head 21 and the thin film piezoelectric unit 27 is extended nearly to the arm, but is not shown in the drawing. From the thin film piezoelectric element 27, for example, the first principal electrode film 440 of the first piezoelectric element unit 27A and the first principal electrode film 580 of the second piezoelectric element unit 27B are connected to an electrode wiring provided on the flexure 4 at the bottom of the thin film piezoelectric element 27, and the second principal electrode film 540 of the first piezoelectric element unit 27A and the second principal electrode film 600 of the second piezoelectric element unit 27B are connected to this electrode wiring by a wire lead, but they are not shown in the drawing.

In the connection configuration shown in FIG. 2, for example, when a positive potential is applied to the wiring connection part 181 and a negative potential to the wiring connection part 182 from the driving power source 3, the first principal electrode film 440 and second principal electrode film 540 of the first piezoelectric element unit 27A are at a positive potential, and the first principal electrode film 580 and second principal electrode film 600 of the second piezoelectric element unit 27B are at a negative potential. Further, positive and negative electrodes are induced in the first counter electrode film 480 and second counter electrode film 500 commonly connected to the first piezoelectric element unit 27A and the second piezoelectric element unit 27B by way of the bonding-region A, and cancel each other such that the potential is kept at zero. This has been confirmed by experiment. Accordingly, only by applying voltages to two wiring connection parts 181, 182, for example, the first piezoelectric thin film 460 and second piezoelectric thin film 520 of the first piezoelectric element unit 27A are contracted, and the first piezoelectric thin film 460 and second piezoelectric thin film 520 of the second piezoelectric element unit 27B are extended. Therefore, the displacement of the first piezoelectric element unit 27A and second piezoelectric element unit 27B occurs in reverse parallel directions. As a result, the flexure 4 to which the thin film piezoelectric element 27 is fixed is also deformed, and the head slider 43 rotates as indicated by arrow C, and the magnetic head 21 on the head slider 43 can be moved finely.

In this exemplary embodiment, as shown in FIG. 1 and FIG. 2, the first piezoelectric element unit 27A and second piezoelectric element unit 27B are formed in the bonding-region A in a shape for integrally coupling the first piezoelectric thin film 460, first counter electrode film 480, second counter electrode film 500, and second piezoelectric thin film 520. Therefore, the thin film piezoelectric element 27 can be driven without connecting the first counter electrode film 480 of the first piezoelectric element unit 27A and the second counter electrode film 500 of the second piezoelectric element unit 27B to the grounding electrode. Hence, the wiring connection can be composed of two terminal wirings only, and the assembling can be simplified. Further, via holes and wiring layers for connecting the first counter electrode film 480 and second counter electrode film 500 to the grounding electrode are not needed, and the manufacturing process is substantially simplified.

Figure 4:
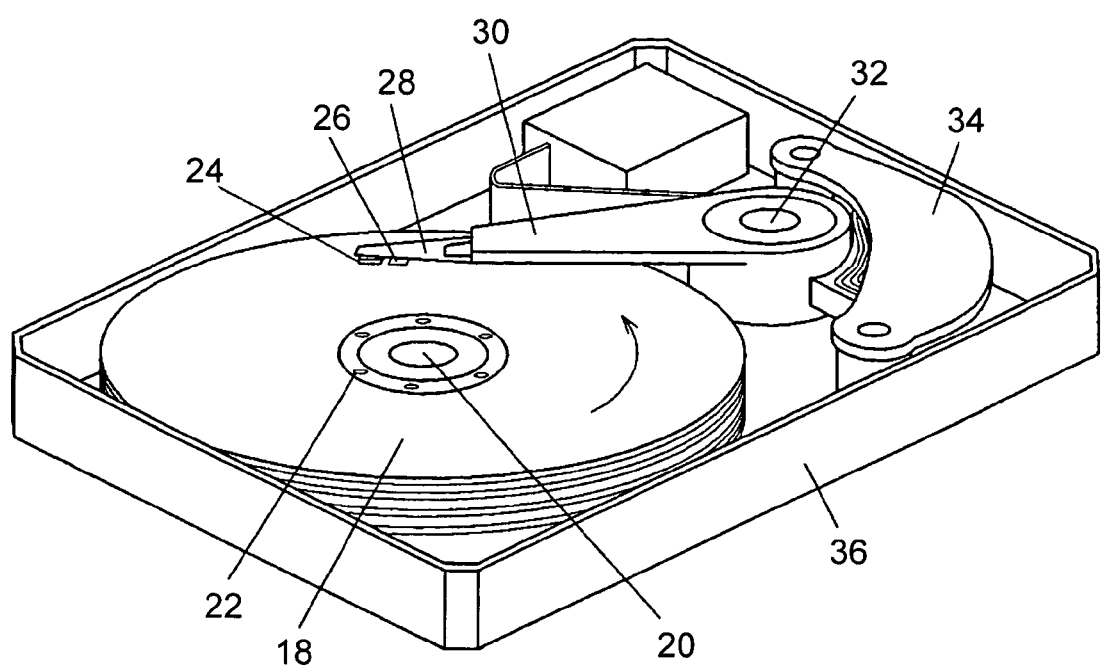
FIG. 4 is an essential perspective view of a disk device using the thin film piezoelectric element of the first exemplary embodiment as an actuator.

FIG. 4 is an essential perspective view of a disk device using this thin film piezoelectric element 27 as an actuator for fine positioning. A disk 18 is fixed to a spindle 20, and rotated at a specified speed by a rotary drive unit 22. As the rotary drive unit 22, generally, a spindle motor is used. A suspension 28 having flexures (not shown) disposed at the side facing the disk 18 is fixed to an arm 30, and this arm 30 is rotatably supported by a bearing 32. A head slider 24 is fixed to a flexure (not shown). Similarly, the thin film piezoelectric element 27 is also adhered to the flexure, and thereby an actuator 26 is composed.

The arm 30 is oscillated by first positioning device 34, and the head slider 24 is positioned at a specified track position of the disk 18. In a conventional disk device, only this first positioning device 34 was used, but this exemplary embodiment further includes second positioning device, and the head slider 24 is moved finely by the actuator 26. This motion of the actuator 26 can be controlled by the voltage applied to the thin film piezoelectric element 27, and it can sufficiently follow up to a fine and precise track position, and recording or reproducing at high density is realized. Therefore, for example, high density recording of a disk device using a hard disk is realized. The disk device is entirely covered with a casing 36 and a lid (not shown).

A manufacturing method of the thin film piezoelectric element of this exemplary embodiment will now be explained. As shown in FIG. 6I and FIG. 6J described below, the thin film piezoelectric element 27 is composed of a first structure 45A composing the first piezoelectric element unit 27A and a second structure 45B composing the second piezoelectric element unit 27B. The first principal electrode films, first piezoelectric thin films, first counter electrode films, second principal electrode films, second piezoelectric thin films, and second counter electrode films of the two are mutually identical in material and structure, and they are integrally formed on the substrate.

Figure 5A:
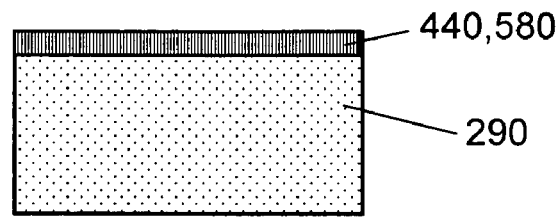
FIG. 5A to FIG. 5C are sectional views of principal processes in a manufacturing method of the thin film piezoelectric element of the first exemplary embodiment.
Figure 5B:
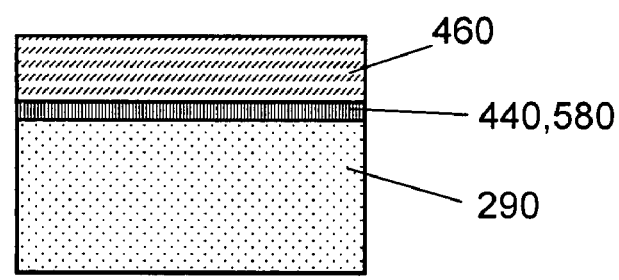
Figure 5C:
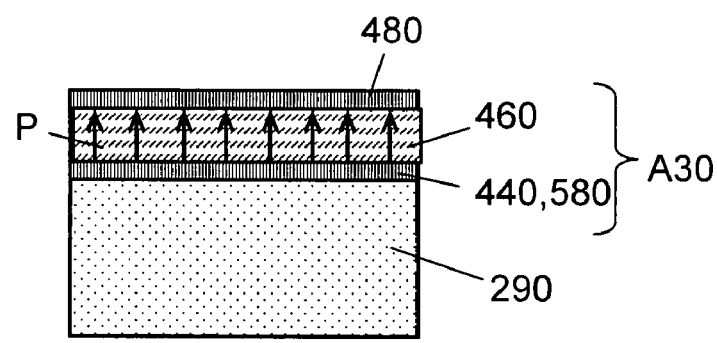

FIG. 5A to FIG. 5C are sectional views of a principal process for forming the thin film piezoelectric element 27, showing a process of batch forming of the first structure 45A and second structure 45B of the thin film piezoelectric element.

First, as shown in FIG. 5A, electrodes are formed on a first substrate 290 as first principal electrode films 440, 580. Next, as shown in FIG. 5B, on the first principal electrode films 440, 580, a first piezoelectric thin film 460 is formed by crystal growth by sputtering, molecular beam evaporation (MBE), chemical vapor deposition (CVD), or a sol-gel method. Further, as shown in FIG. 5C, a first counter electrode film 480 is formed on the top of the first piezoelectric thin film 460. The direction of polarization of the first piezoelectric thin film 460 is directed to the c-axis direction of crystal as indicated by arrow P in FIG. 5C at the time of forming the film. Thus, a first layer unit A30 as the lower structural part of the thin film piezoelectric element 27 shown in FIG. 1 is formed on the first substrate 290. In the same manner, a second layer unit B31 as the upper structural part is formed on a second substrate 295.

FIG. 6A to FIG. 6J are sectional views showing the process of laminating the unit A30 and unit B31 formed in FIG. 5A to FIG. 5C, and forming a piezoelectric element unit. FIG. 6A to FIG. 6J are sectional views similar to FIG. 2, which is taken along line 2—2 of FIG. 1.

Figure 6A:
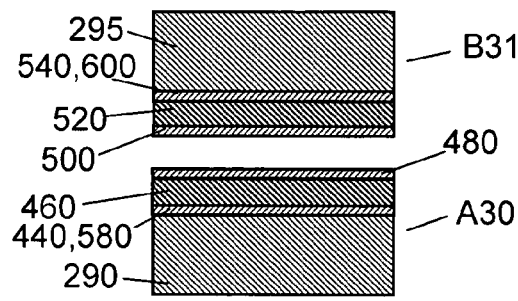
FIG. 6A to FIG. 6J are sectional views explaining the process of laminating unit A30 and unit B31 and forming a piezoelectric element unit in the manufacturing method of the thin film piezoelectric element of the first exemplary embodiment.
Figure 6F:
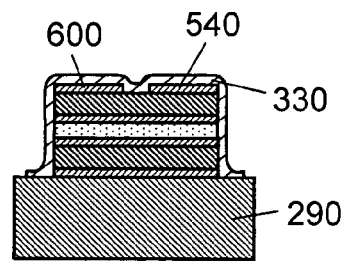

As shown in FIG. 6A, the unit A 30 formed on the first substrate 290 and the unit B31 formed on the second substrate 295 are disposed so that the first counter electrode film 480 and second counter electrode film 500 may face each other.

Figure 6B:
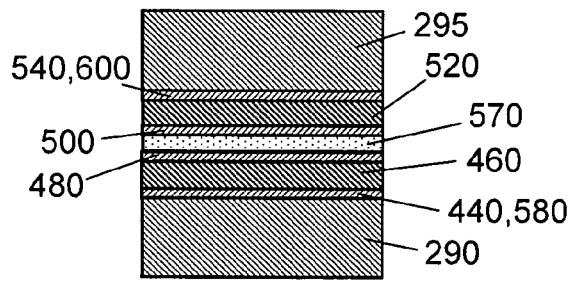
Figure 6G:
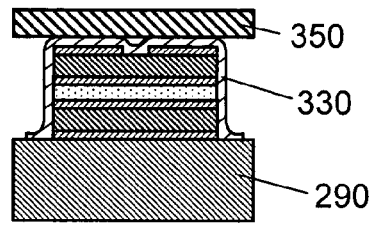

As shown in FIG. 6B, an adhesive layer 570 is disposed between the first counter electrode film 480 and second counter electrode film 500, and the both are bonded together by this adhesive layer 570.

Figure 6C:
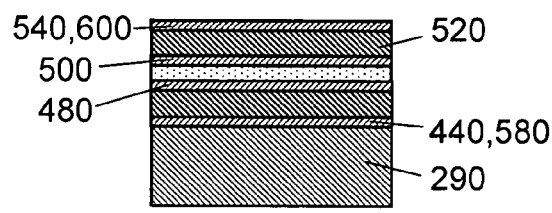
Figure 6H:
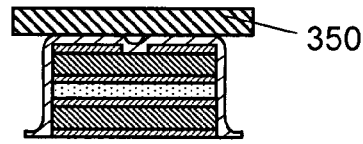

As shown in FIG. 6C, the second substrate 295 of the unit B31 is removed by etching.

Figure 6D:
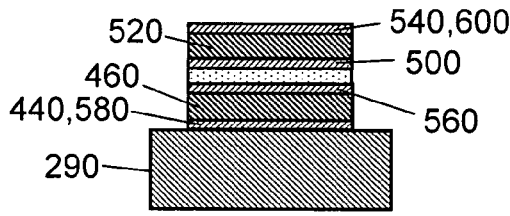
Figure 6I:
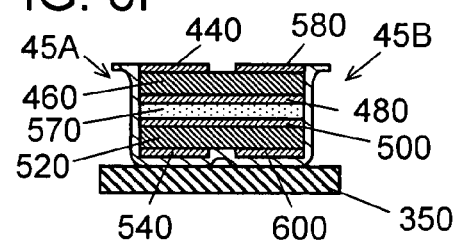
Figure 7A:
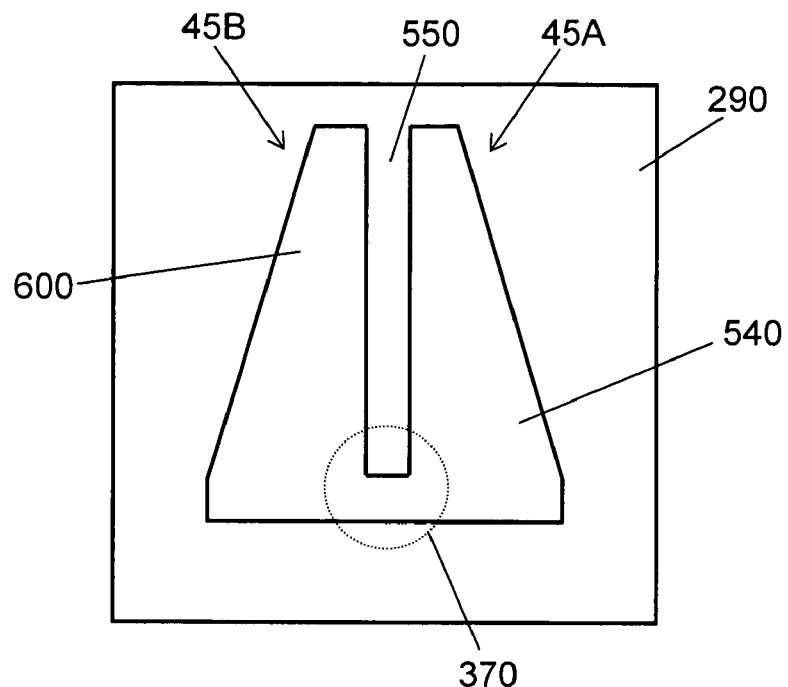
FIG. 7A is a plan view showing the process of FIG. 6D in the manufacturing method of the thin film piezoelectric element of the first exemplary embodiment.

As shown in FIG. 6D, the films of the laminate structure are processed by photolithography and etching to form into a shape of the thin film piezoelectric element 27. In this exemplary embodiment, the first structure 45A and second structure 45B are formed by integrally coupling in the bonding-region A shown in FIG. 1. FIG. 7A is a plan view showing a state of processing up to that shown in FIG. 6D. The first structure 45A and second structure 45B are etched in an integrally coupled shape by a connection part 370 as the bonding-region A. A slit 550 is formed between the first structure 45A and second structure 45B, and the first structure 45A and second structure 45B are completely separated except for the connection part 370.

Figure 6E:
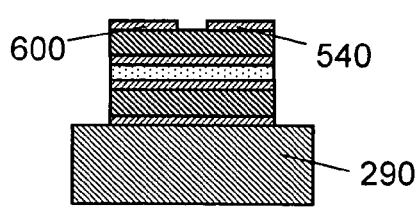
Figure 6J:
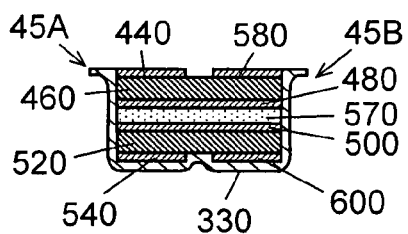
Figure 7B:
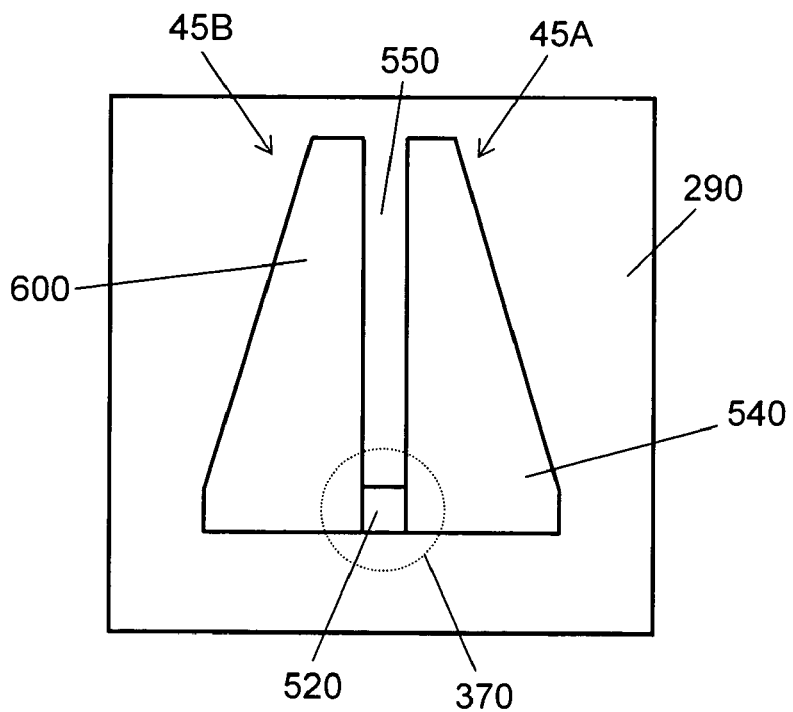
FIG. 7B is a plan view showing the process of FIG. 6E in the manufacturing method of the thin film piezoelectric element of the first exemplary embodiment.

As shown in FIG. 6E, of the etched second principal electrode films 540, 600 of the thin film piezoelectric element 27, the electrode film formed on the connection part 370 is removed by photolithography and etching. FIG. 7B is a plan view showing a state of processing up to that shown in FIG. 6E. As shown in FIG. 7B, the electrode film is etched in the connection part 370, and the second piezoelectric thin film 520 is exposed, and the second principal electrode films 540, 600 are separated from each other.

As shown in FIG. 6F, to prevent corrosion of the thin film piezoelectric element, the surface of the thin film piezoelectric element is coated with a coating resin 330.

As shown in FIG. 6G, a temporary fixing substrate 350 is provisionally bonded to the second principal electrode films 540, 600 via the coating resin 330, and the first substrate 290 is removed by etching in this state. A state after removal of the first substrate 290 by etching is shown in FIG. 6H.

As shown in FIG. 6I, part of the electrode film that is to form the first principal electrode films 440, 580 is removed by photolithography and etching, so as to form connection part 370.

Finally, as shown in FIG. 6J, the temporary fixing substrate 350 is peeled off. Then, the first structure 45A and second structure 45B forming the first principal electrode films 440, 580 are adhered onto the flexure 4 as shown in FIG. 3. Afterwards, the first principal electrode film 440 and second principal electrode film 540 of the first piezoelectric element unit 27A and the first principal electrode film 580 and second principal electrode film 600 of the second piezoelectric element unit 27B are connected to each other, respectively. These connections may be accomplished in the thin film piezoelectric element 27, or they may be connected by the wiring of the flexure 4.

Figure 8:
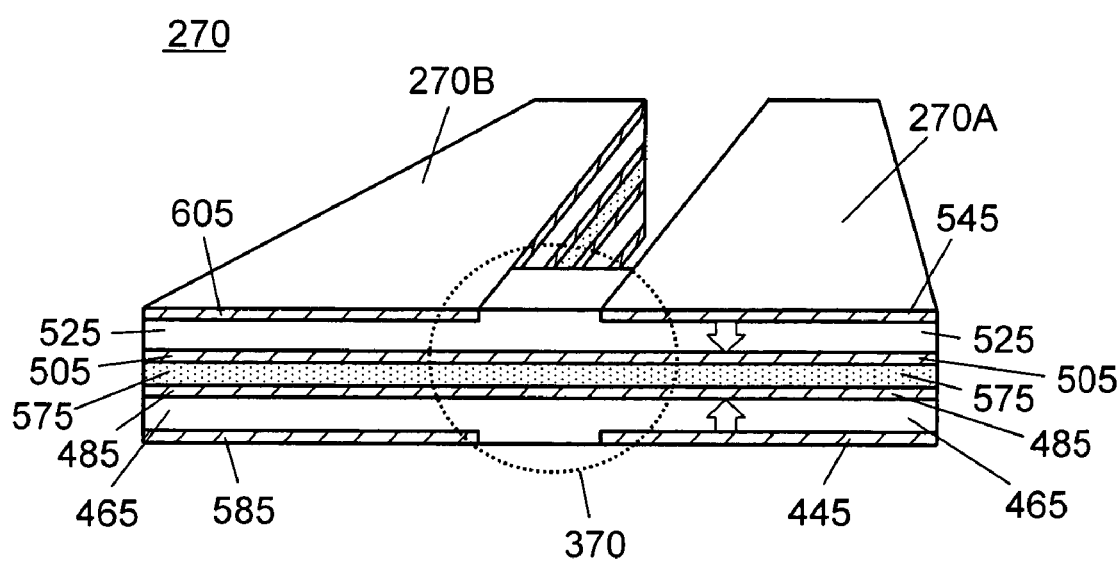
FIG. 8 is a schematic perspective view of a thin film piezoelectric element fabricated in a modified example of the manufacturing method of the thin film piezoelectric element of the first exemplary embodiment.

FIG. 8 is a schematic perspective view of a thin film piezoelectric element 270 fabricated in a modified example of the manufacturing method of the first exemplary embodiment. A first piezoelectric element unit 270A and a second piezoelectric element unit 270B are integrated by a connection part 370 as a bonding-region. In the connection part 370, a first piezoelectric thin film 465 and a second piezoelectric thin film 525 are formed so that first principal electrode films 445, 585 and second principal electrode films 545, 605 may be formed on a the plane, respectively. The first piezoelectric thin film 465 is on the same plane as the first principal electrode films 445, 585, and the second piezoelectric thin film 525 is on the same plane as the second principal electrode films 545, 605.

A manufacturing method of this thin film piezoelectric element 270 is briefly described below. On a first substrate, a first principal electrode film having a slit of a specified width is formed by using a specified mask, and a first piezoelectric thin film and a first counter electrode film are laminated sequentially. Similarly, using a mask of the same shape as the mask forming the first principal electrode film, a second principal electrode film is formed on a second substrate, and a second piezoelectric thin film and a second counter electrode film are laminated sequentially.

The first counter electrode film and second counter electrode film are disposed face to face so that the slit of the first principal electrode film and the slit of the second principal electrode film may coincide in position, and are adhered and fixed by way of an adhesive layer. Later, only the second substrate is removed selectively.

The first principal electrode film, first piezoelectric thin film, first counter electrode film, second principal electrode film, second piezoelectric thin film, second principal electrode film, and adhesive layer are processed into specified shapes, and a pair of structures are formed so that the piezoelectric action regions may be mirror symmetrical by reference to the center line of the slits, and so that the slits maybe positioned on the bonding-region of a partially integral structure.

The pair of structures is coated with a resin layer, a temporary fixing substrate is adhered, and only the first substrate is removed selectively, for example, by an etching process. When the temporary fixing substrate is separated by lowering the adhesion of the adhesive layer adhering the temporary fixing substrate, the thin film piezoelectric element 270 as shown in FIG. 8 is obtained.

Thus, it is a feature of the manufacturing method of this modified example that the films are formed by using the mask with the mask pattern having a region not forming the electrode in a slit shape between the first principal electrode film 465 and the first principal electrode 585, and between the second principal electrode film 545 and the second principal electrode 605. The other parts are formed the same as in the first exemplary embodiment.

Second Exemplary Embodiment

A second exemplary embodiment of the invention differs from the first exemplary embodiment as follows: a wiring connection part between a first principal electrode film and a second principal electrode film in each piezoelectric element unit is formed by direct patterning, for example, by way of forming the electrode films using a mask, in an outer circumferential region of each piezoelectric element unit and in a region hardly having effects on the piezoelectric characteristic, and the connection structure for connection with external terminals is simplified.

Figure 9:
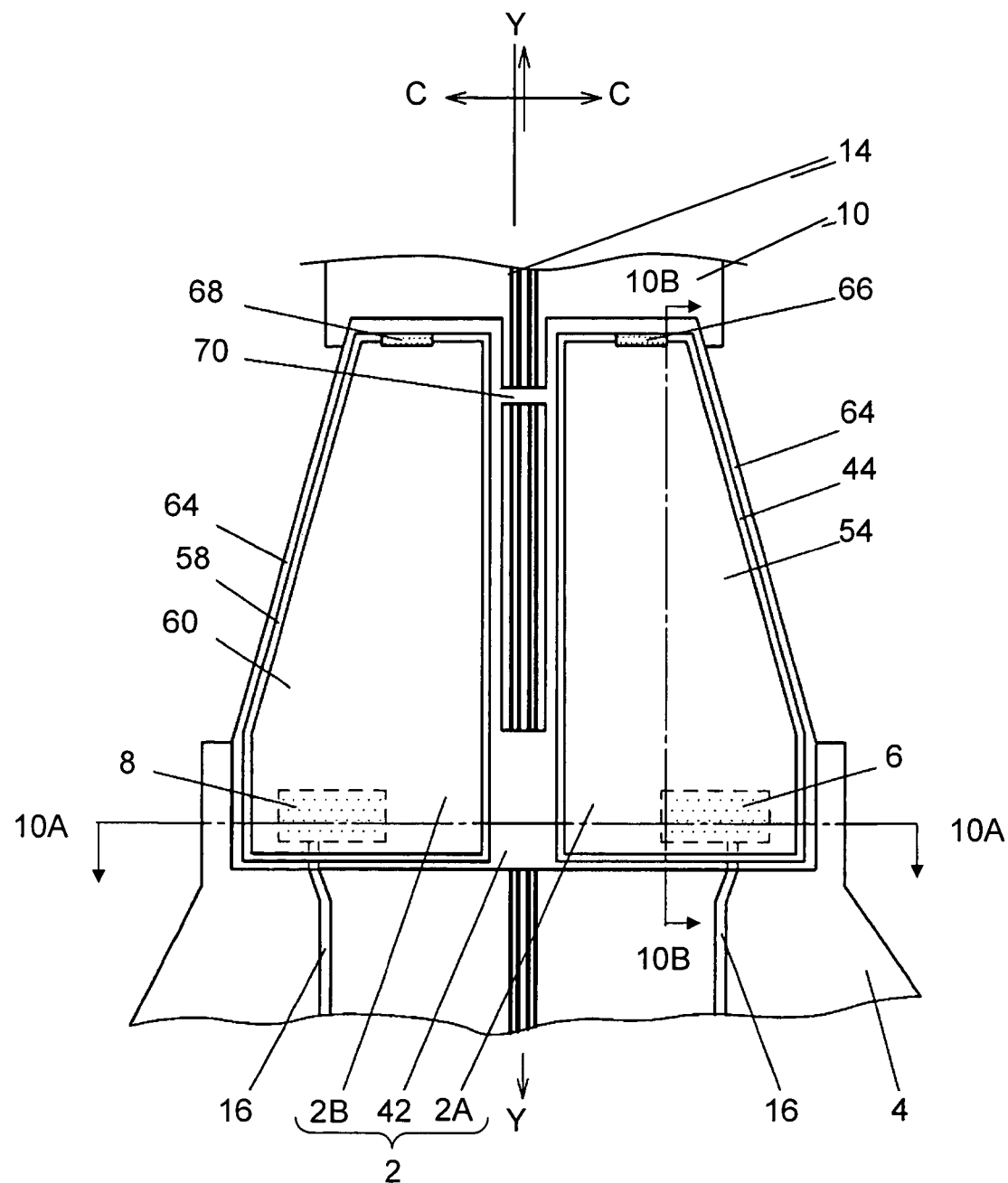
FIG. 9 is a sectional view of an actuator region portion composed by using a thin film piezoelectric element in a second exemplary embodiment of the invention.

This second exemplary embodiment is explained by referring to FIG. 9 to FIG. 16F. FIG. 9 is a plan view of an actuator region portion for fine positioning composed by using a thin film piezoelectric element 2 in the second exemplary embodiment of the invention. This actuator is used for positioning the head slider 24 in the disk device explained in the first exemplary embodiment finely and precisely at the specified track position on the disk 18, and the configuration is basically the same as shown in FIG. 3. In FIG. 9, as in FIG. 3, a thin film piezoelectric element 2 is adhered and fixed on a flexure 4, and the actuator is composed.

In this thin film piezoelectric element 2, a first piezoelectric element unit 2A and a second piezoelectric element unit 2B in a mutually mirror symmetrical relation with respect to line Y—Y are integrally coupled in a bonding-region 42, and individual first counter electrode films and second counter electrode films are mutually connected electrically. The individual first principal electrode films of the first piezoelectric element unit 2A and second piezoelectric element unit 2B are directly connected to piezoelectric electrode pads 6, 8 formed on a flexure 4 respectively by way of, for example, a conductive adhesive layer.

The flexure 4 has a slider holder 10 extended from the region of adhering the thin film piezoelectric element 2 for fixing a head slider (not shown). This slider holder 10 has a head electrode pad (not shown) for connecting to a wiring part of a head (not shown) mounted on the head slider. From this head electrode pad, a head electrode wiring 14 is extended onto the flexure 4 between the first piezoelectric element unit 2A and second piezoelectric element unit 2B of the thin film piezoelectric element 2, and is further extended up to a connection pad (not shown) with an external device and, in the same manner, a piezoelectric electrode wiring 16 is provided for connecting with the piezoelectric electrode pads 6, 8.

The operation of the actuator having such configuration is the same as the operation as explained for the first exemplary embodiment, and its detailed description is thus omitted. This actuator is mounted on a disk device shown in FIG. 4, and the head can be positioned with high precision at the specified track position on the disk. For example, supposing the thickness of each piezoelectric thin film of the thin film piezoelectric element 2 to be 2.5 µm, when +5 V is applied to the principal electrode film of the first piezoelectric element unit 2A, and −5 V is applied to the principal electrode film of the second piezoelectric element unit 2B, the displacement of the head portion may be adjusted to ±0.8 µm in the direction of arrow C.

Figure 10A:
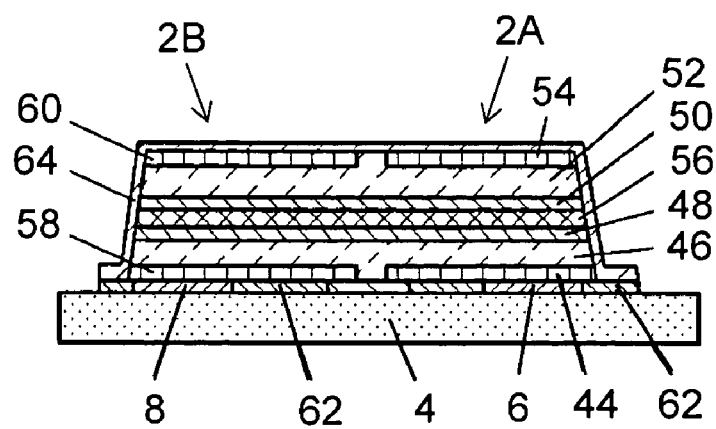
FIG. 10A is a sectional view of the thin film piezoelectric element of the second exemplary embodiment, along line 10A—10A of FIG. 9.
Figure 10B:
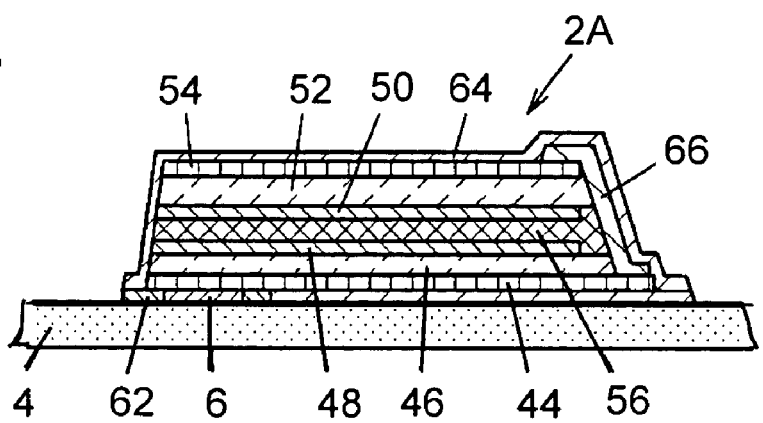
FIG. 10B is a sectional view of the thin film piezoelectric element of the second exemplary embodiment, along line 10B—10B of FIG. 9.

A sectional structure of the thin film piezoelectric element 2 composing this actuator is shown in FIG. 10A and FIG. 10B. FIG. 10A shows a sectional shape along line 10A—10A of FIG. 9, and FIG. 10B shows a sectional shape along line 10B—10B of FIG. 9. By referring to FIG. 9, FIG. 10A and FIG. 10B, the configuration of the thin film piezoelectric element 2 is explained. The thin film piezoelectric element 2 of the exemplary embodiment is composed of the first piezoelectric element unit 2A, second piezoelectric element unit 2B, and bonding-region 42 for connecting them, in the portion along line 10A—10A of FIG. 9.

The first piezoelectric element unit 2A consists of a first piezoelectric thin film 46 enclosed between a first principal electrode film 44 and a first counter electrode film 48, and a second piezoelectric thin film 52 enclosed between a second principal electrode film 54 and a second counter electrode film 50, which are bonded together by way of an insulating adhesive layer 56, with the first counter electrode film 48 and second counter electrode film 50 face to face. Similarly, the second piezoelectric element unit 2B consists of a first piezoelectric thin film 46 enclosed between a first principal electrode film 58 and a first counter electrode film 48, and a second piezoelectric thin film 52 enclosed between a second principal electrode film 60 and a second counter electrode film 50, which are bonded together by way of an insulating adhesive layer 56, with the first counter electrode film 48 and second counter electrode film 50 face to face.

In the bonding-region 42, the first counter electrode film 48, first piezoelectric thin film 46, second counter electrode film 50, second piezoelectric thin film 52, and insulating adhesive layer 56 for composing the first piezoelectric element unit 2A and second piezoelectric element unit 2B are integrally coupled and formed. As a result, the first piezoelectric element unit 2A and second piezoelectric element unit 2B are integrated, and the respective counter electrode films 48 and second counter electrode films 50 are mutually connected electrically.

As shown in FIG. 10B, at the leading end of the first piezoelectric element unit 2A, that is, at the side to be mounted adjacent the head slider, the first principal electrode film 44 and second principal electrode film 54 are electrically connected by way of a wiring connection part 66 made of a conductor film. Similarly, at the leading end of the second piezoelectric element unit 2B, a wiring connection part 68 made of a conductor film is formed as shown in FIG. 9, and the first principal electrode film 58 and second principal electrode film 60 are connected. These wiring connection parts 66, 68 are protected by an insulating adhesive layer 56 so as not to be connected electrically to the first counter electrode film 48 and second counter electrode film 50.

For the thin film piezoelectric element 2 thus composed, the operation is same as that explained for the first exemplary embodiment and the detailed explanation is thus omitted.

This thin film piezoelectric element 2 is electrically adhered and fixed directly on piezoelectric electrode pads 6, 8 formed by part of the first principal electrode films 44, 48 on the flexure 4 by means of an adhesive layer 62. As the conductive adhesive layer 62, a conductive adhesive having silver particles, other metal particles or carbon blended therein may be used. As another adhering method, ordinary soldering can be employed.

In such configuration, it is easy to dispose the thin film piezoelectric element 2 on the flexure 4 and connect it with the piezoelectric electrode pads 6, 8, and the reliability of the resultant device is enhanced. Hence, actuators with high productivity are realized. Both the first piezoelectric element unit 2A and the second piezoelectric element unit 2B of the thin film piezoelectric element 2 are formed of a structure in which warping or bending is hardly superposed in expansion and contraction motions, and by using them as a pair so as to extend the one and contract the other, displacement in a direction nearly at perpendicular to the expansion and contraction directions may be generated precisely.

Besides, since the first piezoelectric element unit 2A and second piezoelectric element unit 2B are integrated in the bonding-region, the thin film piezoelectric element 2 is easy to handle during mounting.

As shown in FIG. 9, meanwhile, by forming a reinforcement 70 of resin material on the thin film piezoelectric element 2 and an insulating resin layer 64 on the surface excluding the electrode pads, the strength of the integrated body can be increased without practically disturbing the piezoelectric motion, and handling is easier, and the reliability including humidity resistance can be further enhanced.

As described herein, the manufacturing process of the thin film piezoelectric element 2 of the second exemplary embodiment does not require the electrode pad forming step for external connection from the first counter electrode film 48 and second counter electrode film 50 formed inside when adhered. Further, a complicated photolithography or etching process is not needed because the first principal electrode films 44, 58 and second principal electrode films 54, 60 are electrically connected by the wiring connection parts 66, 68 of conductor film at each leading end. Since it is not necessary to etch the piezoelectric conductor film when forming the wiring connection parts 66, 68, defects due to residual etching can be prevented. As a result, the manufacturing process of the thin film piezoelectric element 2 can be substantially simplified, and the yield can be enhanced.

The manufacturing method of the thin film piezoelectric element 2 of the exemplary embodiment is explained in detail while referring to FIG. 11A to FIG. 16F.

Figure 11A:
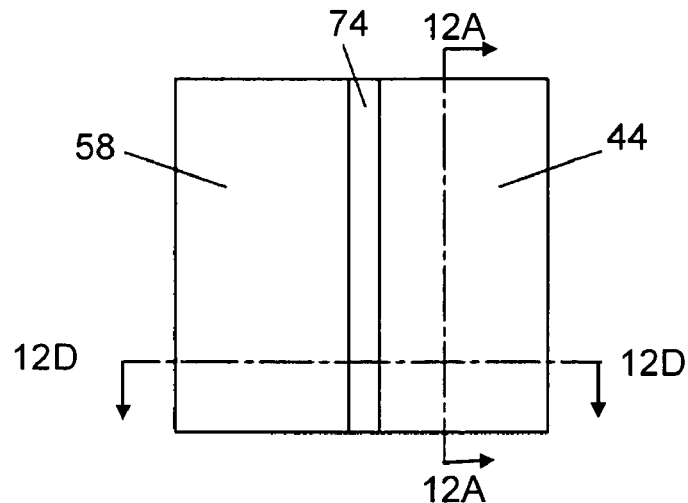
FIG. 11A to FIG. 11C are plan views showing a process of forming and processing thin films on a first substrate in a manufacturing method of the thin film piezoelectric element of the second exemplary embodiment.
Figure 11B:
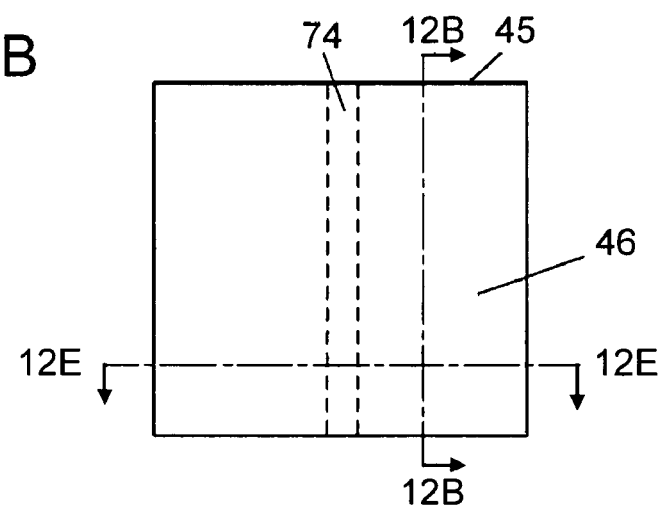
Figure 11C:
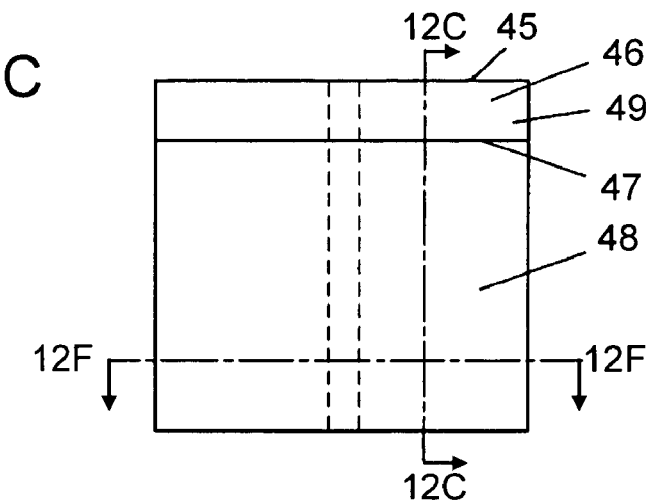
Figure 12A:
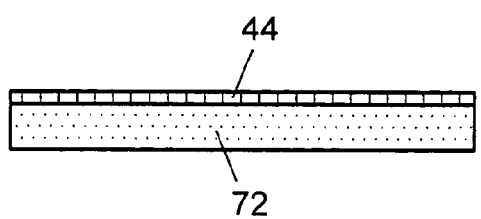
FIG. 12A to FIG. 12C are sectional views along lines 12A—12A, 12B—12B and 12C—12C of FIG. 11A to FIG. 11C, respectively, in the manufacturing method of the thin film piezoelectric element of the second exemplary embodiment.
Figure 12D:
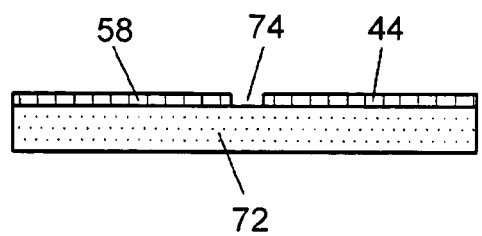
FIG. 12D to FIG. 12F are sectional views along lines 12D—12D, 12E—12E and 12F—12F of FIG. 11A to FIG. 11C, respectively, in the manufacturing method of the thin film piezoelectric element of the second exemplary embodiment.
Figure 12B:
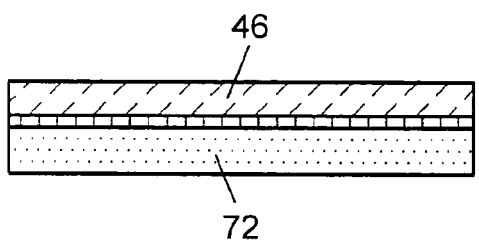
Figure 12E:
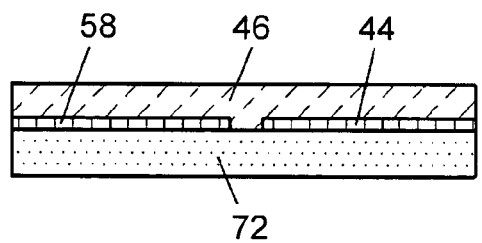
Figure 12C:
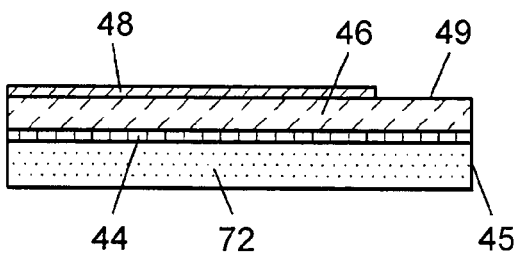
Figure 12F:
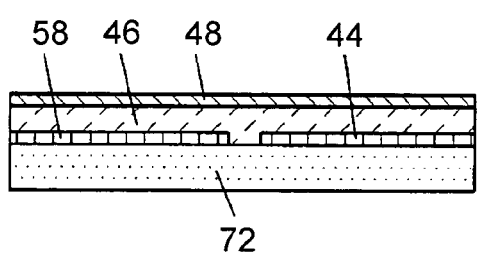

First, reference is made to FIG. 11A to FIG. 12F. FIG. 11A to FIG. 11C are plan views showing the process of forming and processing thin films on a first substrate. FIG. 12A to FIG. 12C are sectional views along lines 12A—12A, 12B—12B and 12C—12C of FIG. 11A to FIG. 11C, respectively, and FIG. 12D to FIG. 12F are sectional views along lines 12D—12D, 12E—12E and 12F—12F of FIGS. 11A, 11A to FIG. 11C, respectively.

As shown in FIG. 11A, FIG. 12A and FIG. 12D, on a first substrate 72, first principal electrode films 44, 58 are formed, so as not to be formed in a first slit 74, for example, by a vapor deposition technique using a mask. Next, as shown in FIG. 11B, FIG. 12B and FIG. 12E, a first piezoelectric thin film 46 is formed on the entire surface of the first substrate 72. Therefore, the first piezoelectric thin film 46 is formed to fill up the first slit 74. Further, as shown in FIG. 11C, FIG. 12C and FIG. 12F, a first counter electrode film 48 is formed on the first piezoelectric thin film 46, in a region smaller than the first principal electrode films 44, 58, that is, on the entire surface other than a predetermined region 49 bounded by a line 47 parallel to and spaced apart from the upper end 45 of the first substrate 72 and a predetermined position of the first substrate 72, which can be the upper end 45 of the first substrate 72. In addition, since a plurality of the thin film piezoelectric elements 2 can be formed on the first substrate 72, in a case in which the thin film piezoelectric element 2 is placed at the upper end 45 of the first substrate 72, the predetermined region 49 may be provided by setting the upper end 45 as the predetermined position. On the other hand, in a case in which the thin film piezoelectric element 2 is placed somewhere other than at the upper end 45 of the first substrate 72, the predetermined region 49 may be provided, for example, by setting the center line of an area between spaced apart thin film piezoelectric elements 2 as the predetermined position.

On a second substrate, thin films are similarly formed as in the case of the first substrate 72, with a second slit being formed at the same position as the first slit 74. The manufacturing method for the second substrate is same as in the case of the first substrate, and therefore, a detailed explanation is omitted. The structure formed on the second substrate is explained later with reference to FIG. 14D. The predetermined region 49 is a region for forming protrusions extending from the first principal electrode films 44, 58 as described below, and it may be formed at the side opposite to the side illustrated in FIGS. 11C, 12C and 12F.

Figure 13A:
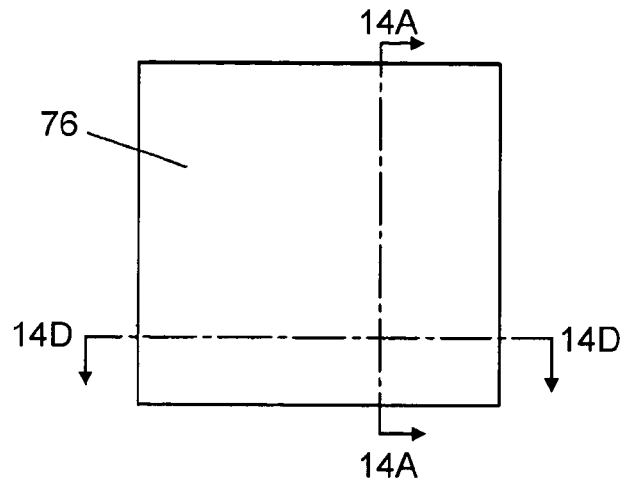
FIG. 13A to FIG. 13C are plan views showing a process of adhering and fixing substrates mutually and patterning as specified in the manufacturing method of the thin film piezoelectric element of the second exemplary embodiment.
Figure 13B:
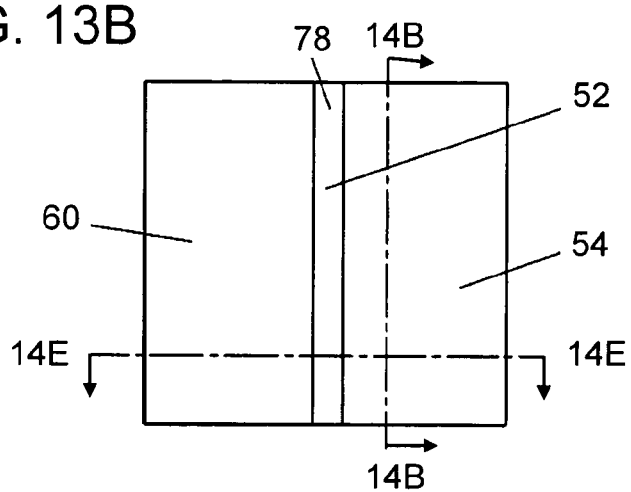
Figure 13C:
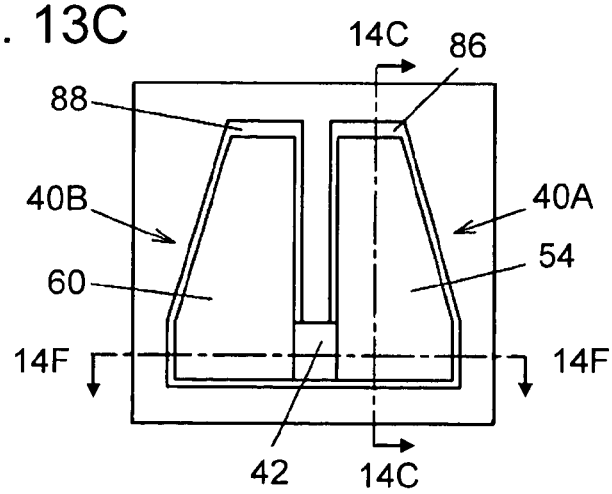
Figure 14A:
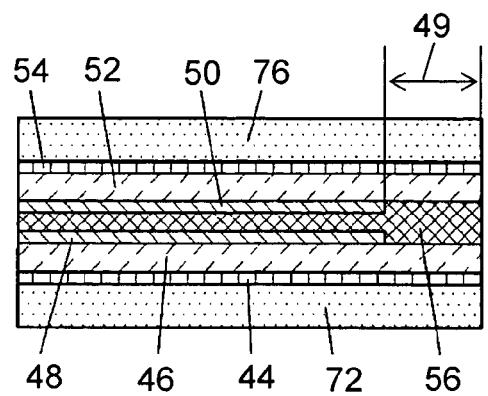
FIG. 14A to FIG. 14C are sectional views along lines 14A—14A, 14B—14B and 14C—14C of FIG. 13A to FIG. 13C, respectively, in the manufacturing method of the thin film piezoelectric element of the second exemplary embodiment.
Figure 14D:
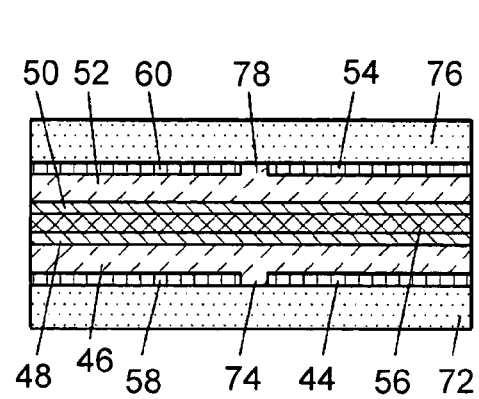
FIG. 14D to FIG. 14F are sectional views along lines 14D—14D, 14E—14E and 14F—14F of FIG. 13A to FIG. 13C, respectively, in the manufacturing method of the thin film piezoelectric element of the second exemplary embodiment.
Figure 14B:
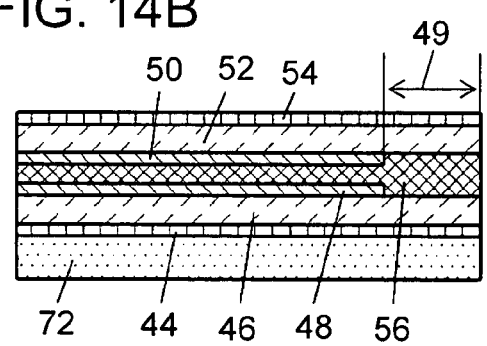
Figure 14E:
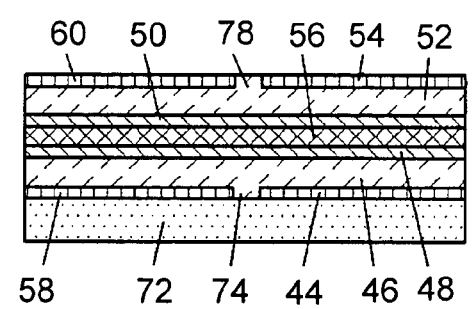
Figure 14C:
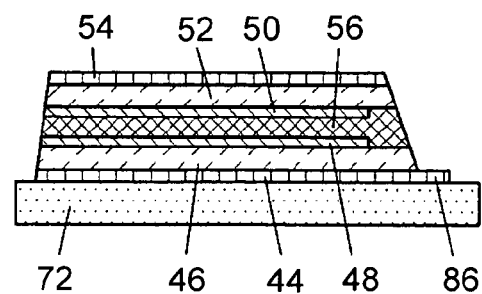
Figure 14F:
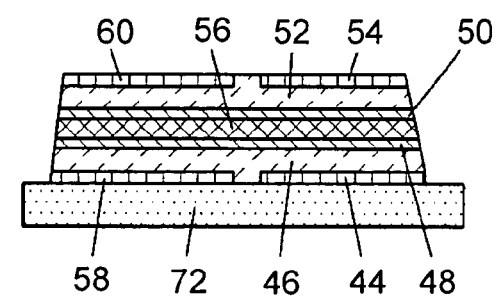

FIG. 13A to FIG. 13C, and FIG. 14A to FIG. 14F are diagrams explaining the process of adhering and fixing the substrates after processing up to the shape as shown in FIG. 11C, FIG. 12C and FIG. 12F, and patterning as specified on the first substrate 72. FIG. 13A to FIG. 13C are plan views, FIG. 14A to FIG. 14C are sectional views along lines 14A—14A, 14B—14B and 14C—14C of FIG. 13A to FIG. 13C, respectively, and FIG. 14D to FIG. 14F are sectional views along lines 14D—14D, 14E—14E and 14F—14F of FIG. 13A to FIG. 13C, respectively.

Reference is next made to FIG. 13A to FIG. 13C and FIG. 14A to FIG. 14F. FIG. 13A shows the state of adhering and fixing the first counter electrode film 48 and second counter electrode film 50 face to face, and is a plan view as seen from the second substrate 76 side. That is, as shown in FIG. 14A and FIG. 14D, the first piezoelectric thin film 46 enclosed by the first principal electrode films 44, 58 and first counter electrode film 48 on the first substrate 72, and the second piezoelectric thin film 52 enclosed by the second principal electrode films 54, 60 and second counter electrode film 50 on the second substrate 76 are disposed face to face, and adhered and fixed by an insulating adhesive layer 56. As shown in FIG. 14D, each principal electrode film is electrically separated, and as shown in FIG. 14A, in the predetermined region 49, first counter electrode film 48 and second counter electrode film 50 are not formed, and the first piezoelectric thin film 46 and second piezoelectric thin film 52 are adhered to each other by the insulating adhesive layer 56.

As shown in FIG. 13B, FIG. 14B and FIG. 14E, only the second substrate 76 is selectively removed. The removing method can be etching, polishing, or polishing to a specified thickness followed by etching. If the first substrate 72 and second substrate 76 are made of the same material, the first substrate 72 must be coated with a resin not affected by the etchant before the etching process. When the second substrate 76 is removed, the second piezoelectric thin film 52 buried in the second slit 78, and the second principal electrode films 54, 60 separated by the second slit 78, are exposed.

As shown in FIG. 13C, FIG. 14C and FIG. 14F, a first structure 40A and a second structure 40B are formed on the first substrate 72 by photolithography and etching techniques, and a bonding-region 42 is formed for bonding the first structure 40A and second structure 40B. At this time, at the leading ends of the first structure 40A and second structure 40B, protrusions 86, 88 are formed to extend from the first principal electrode films 44, 58.

Figure 15A:
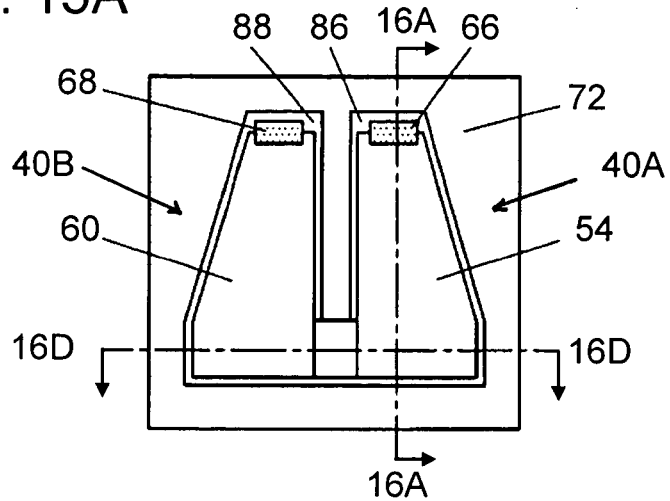
FIG. 15A to FIG. 15C are plan views showing a process of forming wiring connection parts on a first structure and a second structure and completing a thin film piezoelectric element in the manufacturing method of the thin film piezoelectric element of the second exemplary embodiment.
Figure 15B:
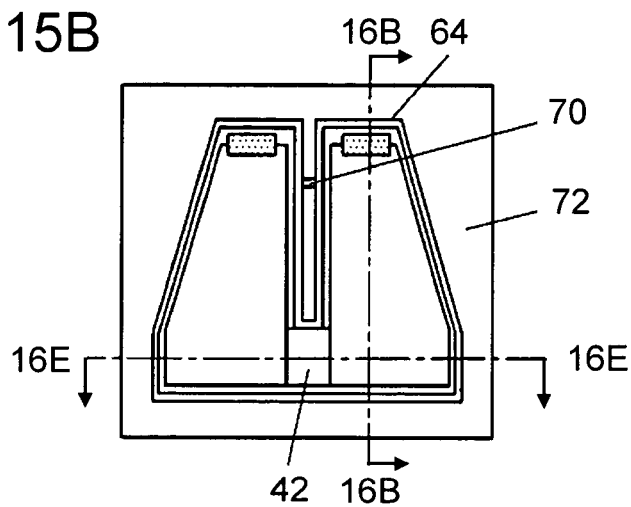
Figure 15C:
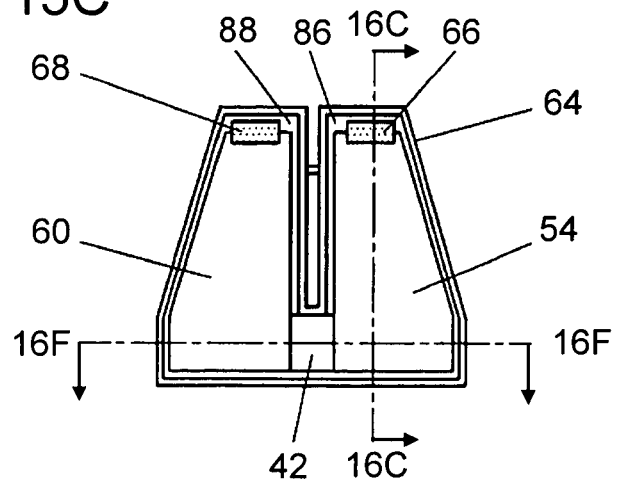
Figure 16A:
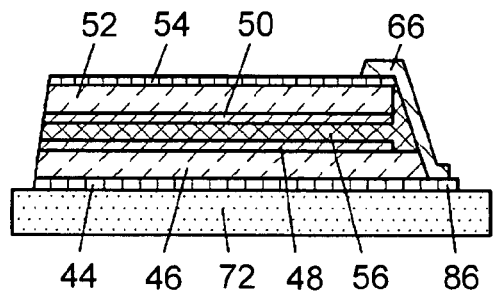
FIG. 16A to FIG. 16C are sectional views along lines 16A—16A, 16B—16B and 16C—16C of FIG. 15A to FIG. 15C, respectively, in the manufacturing method of the thin film piezoelectric element of the second exemplary embodiment.
Figure 16D:
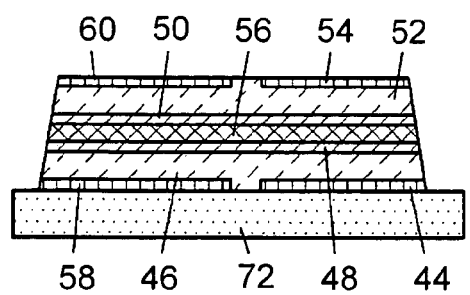
FIG. 16D to FIG. 16F are sectional views along lines 16D—16D, 16E—16E and 16F—16F of FIG. 15A to FIG. 15C, respectively, in the manufacturing method of the thin film piezoelectric element of the second exemplary embodiment.
Figure 16B:
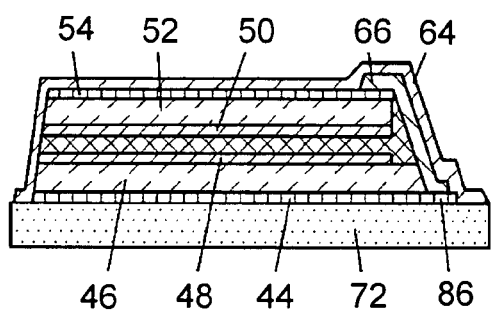
Figure 16E:
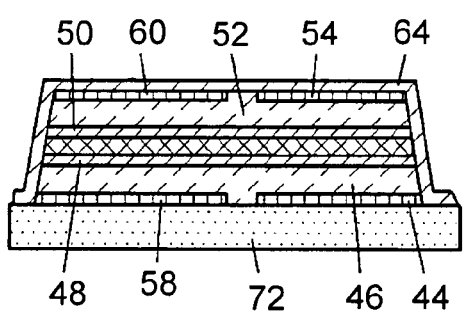
Figure 16C:
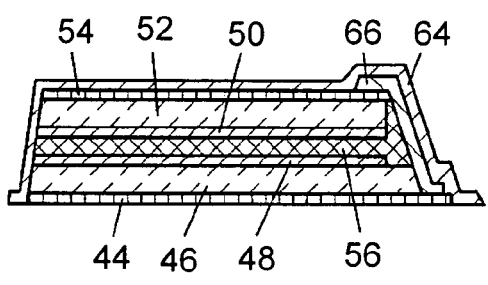
Figure 16F:
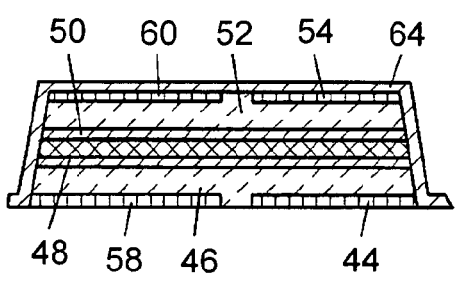

FIG. 15A to FIG. 15C and FIG. 16A to FIG. 16F are plan views and sectional views showing the process of forming wiring connection parts on the first structure 40A and second structure 40B and completing a thin film piezoelectric element. FIG. 16A to FIG. 16C are sectional views along lines 16A—16A, 16B—16B and 16C—16C of FIG. 15A to FIG. 15C, respectively and FIG. 16D to FIG. 16F are sectional views along lines 16D—16D, 16E—16E and 16F—16F of FIGS. 15A to 15C, respectively.

As shown in FIG. 15A, FIG. 16A and FIG. 16D, at the leading ends of the first structure 40A and second structure 40B, a conductor film is formed between the protrusion 86 of the first principal electrode film 44 and the second principal electrode film 54 of the first structure 40A, and a wiring connection part 66 is provided. Similarly, a conductor film is formed between the protrusion 88 of the first principal electrode film 58 and the second principal electrode film 60 of the second structure 40B, and a wiring connection part 68 is provided. The first counter electrode film 48 and second counter electrode film 50 are electrically insulated from the wiring connection parts 66, 68 at the leading ends of the structures by means of the first piezoelectric thin film 46, second piezoelectric thin film 52, and insulating adhesive layer 56.

FIG. 15B, FIG. 16B and FIG. 16E show the state of the insulating resin layer 64 formed on the outer circumference of the first structure 40A and second structure 40B. As a result, the entire structure including the wiring connection parts 66, 68 is coated with the insulating resin layer 64, and the moisture resistance is notably enhanced. Further, when a reinforcement 70 for coupling the first structure 40A and second structure 40B is formed of the same insulating resin material, handling of the thin film piezoelectric element 2 is very easy and damage can be prevented at the same time.

The insulating resin film 64 is formed, for example, by applying a liquid polyimide solution using a spinner, drying at 120° C., and heating and curing at 250° C. Not limited to this method, an organic polymer material may be applied, and formed by thermosetting or photosetting. However, as clear from FIG. 15B, FIG. 16B and FIG. 16E, this insulating resin layer 64 contacts with the side surface of the first counter electrode film 48 and second counter electrode film 50, and hence a sufficient electric insulation is demanded and the material is required to be etched to a specified shape.

In this process, a thin film piezoelectric element 2 is formed on the first substrate 72, and the entire surface of the thin film piezoelectric element 2 is protected with wax or other resin (not shown). Then the first substrate 72 is removed by etching, and the wax or resin adhered to the surface is removed by dissolving, so that the thin film piezoelectric element 2 completely separated from the substrate is obtained. It is shown in FIG. 15C, FIG. 16C and FIG. 16F. Then, it is adhered and fixed on the flexure 4, and an actuator 26 is completed.

Third Exemplary Embodiment

A manufacturing method of a thin film piezoelectric element in a third exemplary embodiment of the invention is similar to the manufacturing method according to the second exemplary embodiment, except that the process of photolithography and etching is further simplified so that a thin film piezoelectric element may be manufactured at a lower cost.

Figure 17A:
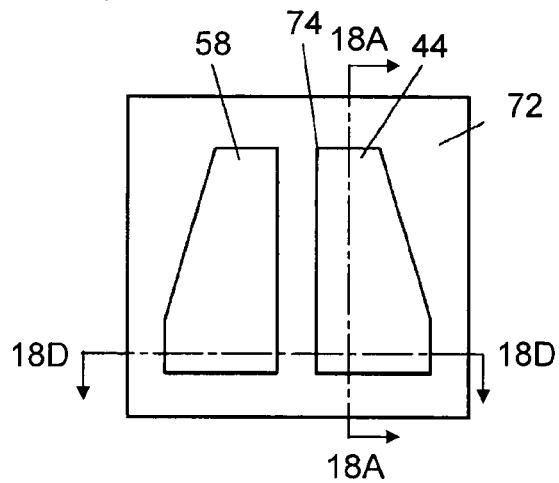
FIG. 17A to FIG. 17C are plan views showing a process of forming a thin film pattern on a first substrate in a manufacturing method of a thin film piezoelectric element in a third exemplary embodiment of the invention.

The thin film piezoelectric element and its manufacturing method of this exemplary embodiment are explained by referring to FIG. 17A to FIG. 21B. FIG. 17A to FIG. 17F and FIG. 18A to FIG. 18H are plan views and sectional views showing the process of forming a specified thin film pattern directly on a first substrate and a second substrate by a film forming method using a mask. FIG. 17A to FIG. 17C are plan views showing the process of forming a specified thin film pattern on a first substrate 72 by a film forming method using the mask, and FIG. 17D to FIG. 17F are plan views similarly showing the process of forming on a second substrate 76. FIG. 18A to FIG. 18C are sectional views along lines 18A—18A, 18B—18B and 18C—18C of FIG. 17A to FIG. 17C, respectively, and FIG. 18D to FIG. 18F are sectional views along lines 18D—18D, 18E—18E and 18F—18F of FIG. 17A to FIG. 17C, respectively.

Figure 17D:
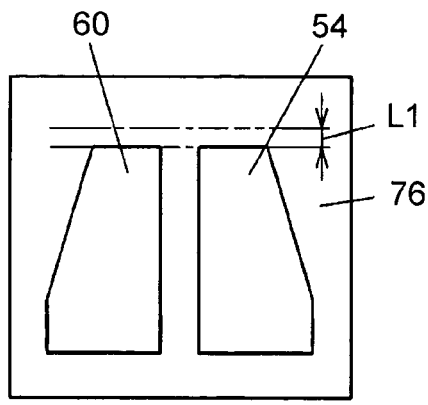
FIG. 17D to FIG. 17F are plan views showing a process of forming a thin film pattern on a second substrate in the manufacturing method of the thin film piezoelectric element of the third exemplary embodiment.
Figure 17B:
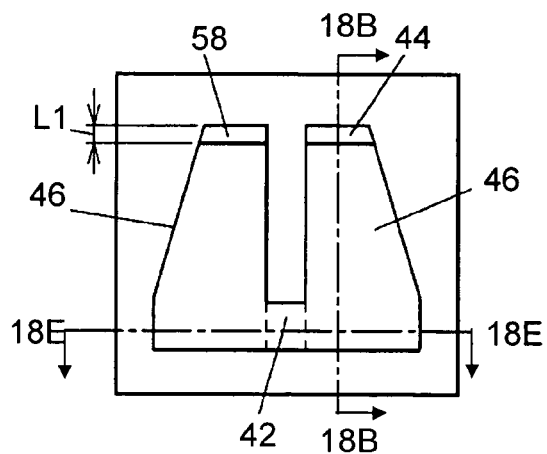
Figure 17E:
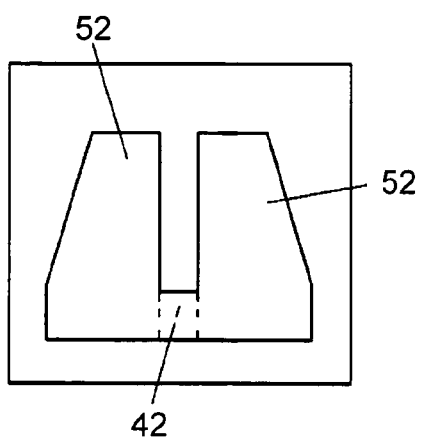
Figure 17C:
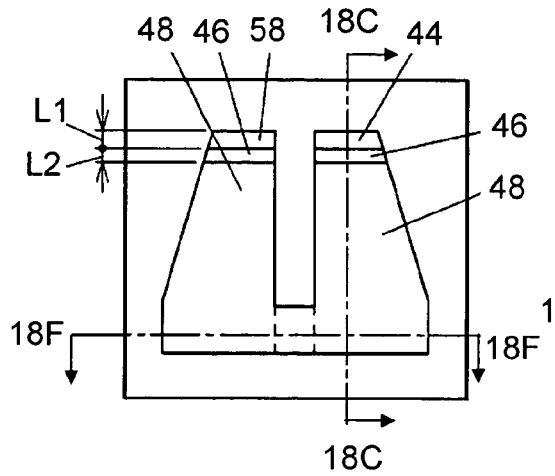
Figure 17F:
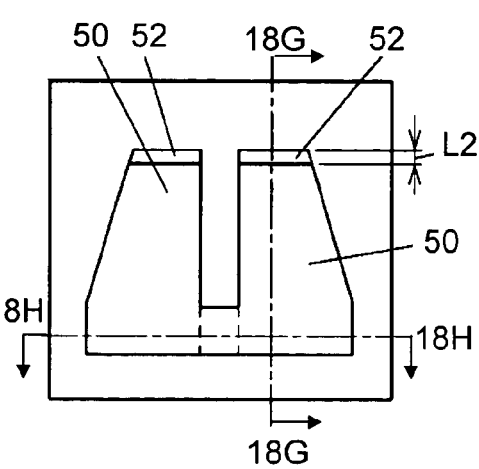
Figure 18A:
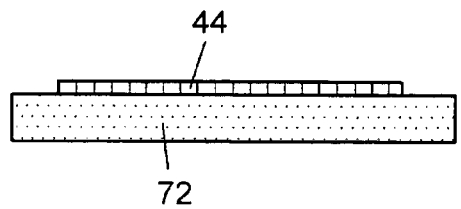
FIG. 18A to FIG. 18C are sectional views along lines 18A—18A, 18B—18B and 18C—18C of FIG. 17A to FIG. 17C, respectively, in the manufacturing method of the thin film piezoelectric element of the third exemplary embodiment.
Figure 18B:
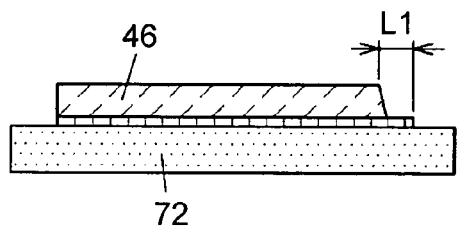
Figure 18C:
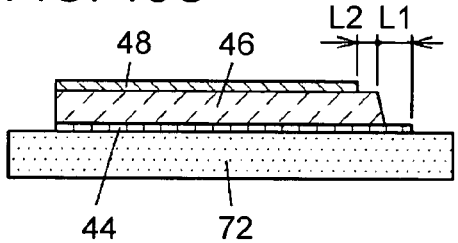
Figure 18D:
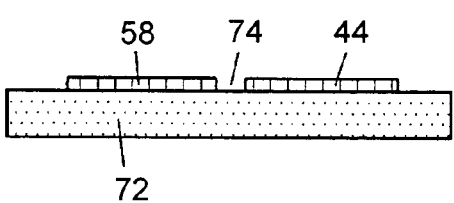
FIG. 18D to FIG. 18F are sectional views along lines 18D—18D, 18E—18E and 18F—18F of FIG. 17A to FIG. 17C, respectively, in the manufacturing method of the thin film piezoelectric element of the third exemplary embodiment.
Figure 18E:
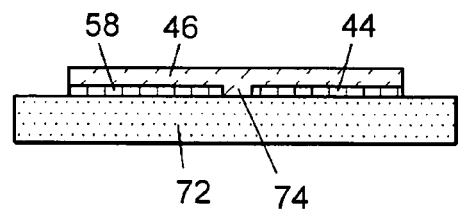
Figure 18F:
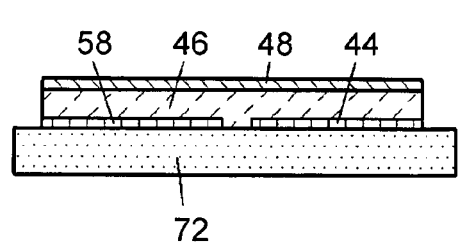
Figure 18G:
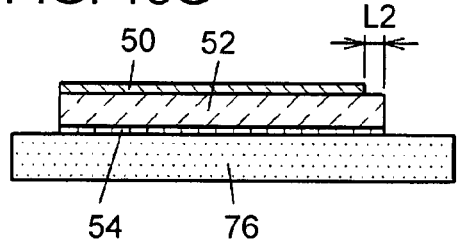
FIG. 18G is a sectional view along line 18G—18G of FIG. 17F in the manufacturing method of the thin film piezoelectric element of the third exemplary embodiment.
Figure 18H:
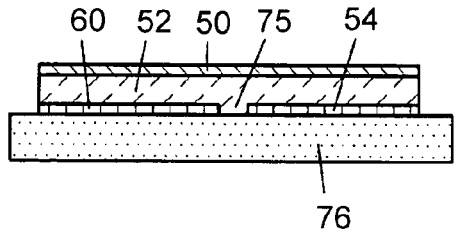
FIG. 18H is a sectional view along line 18H—18H of FIG. 17F in the manufacturing method of the thin film piezoelectric element of the third exemplary embodiment.

The thin film pattern shape and thin film forming method to be formed on the second substrate 76 are nearly the same as the thin film pattern shape and thin film forming method to be formed on the first substrate 72, and therefore only the sectional views along line 18G—18G and along line 18H—18H of FIG. 17F are shown in FIG. 18G and FIG. 18H, respectively, are shown for the thin film pattern shape and forming method being formed with respect to the second substrate 76.

First, as shown in FIG. 17A, FIG. 18A and FIG. 18D, on a first substrate 72, first principal electrode films 44, 58 are formed on both sides of a first slit 74, mirror symmetrically with respect to the first slit 74. They can be formed easily by using a mask having the illustrated shape, and evaporating, for example, a Pt film.

As shown in FIG. 17B, FIG. 18B and FIG. 18E, a U-shaped first piezoelectric thin film 46 is formed, which is on the whole nearly same as the shape of the first principal electrode films 44, 58, but is shorter than the first principal electrode film 44, 58 by L1 only at the leading end as shown in the drawing, and is linked at the bonding-region 42. It can be formed easily by sputtering the film, for example, a PZT film, using the mask as explained in the second exemplary embodiment.

In FIG. 17C, FIG. 18C and FIG. 18F, a first counter electrode film 48 is formed, which is the same in shape as the first piezoelectric thin film 46, but is slightly smaller on the whole and is shorter than the first piezoelectric thin film 46 by L2 only at the leading end as shown in the drawing.

It can be formed easily by using a mask same as in the formation of the first piezoelectric thin film 46 and evaporating, for example, Pt film.

A process for forming film on the second substrate 76 will now be explained. In FIG. 17D, second principal electrode films 54, 60 are formed on a second substrate 76. The second principal electrode films 54, 60 are the same in overall shape as the first principal electrode films 44, 58 formed on the first substrate 72, but the leading ends are shorter than the first principal electrode films 44, 58 by the distance L1. They can be formed easily by using a similar mask, and evaporating, for example, a Pt film.

As shown in FIG. 17E, on the second principal electrode films 54, 60, a U-shaped second piezoelectric thin film 52 is formed, which is nearly the same in the shape as the second principal electrode films 54, 60, but includes a linking portion at the bonding-region 42.

Afterwards, as shown in FIG. 17F, FIG. 18G and FIG. 18H, a second counter electrode film 50 in a same shape as the first counter electrode film 48 is formed on the second piezoelectric thin film 52. As a result, the second counter electrode film 50 is formed shorter than the second piezoelectric thin film 52 at the leading end by the distance L2 as shown in the drawing. The specific distances L1 and L2 are not specified except that they must be sufficient to form the wiring connection parts described below, and they may be properly selected in a range from several μm to 300 μm. These parts become the protrusions of the first principal electrode films 44, 58 for forming the wiring connection parts.

Figure 19A:
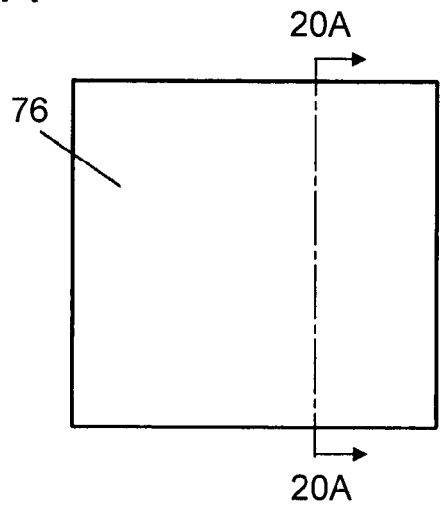
FIG. 19A to FIG. 19C are plan views showing process of adhering a first substrate and a second substrate and forming a thin film piezoelectric element in the manufacturing method of the thin film piezoelectric element of the third exemplary embodiment.
Figure 19B:
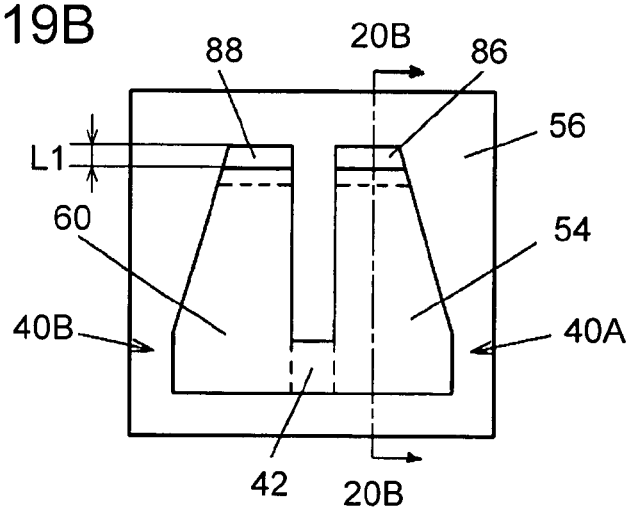
Figure 19C:
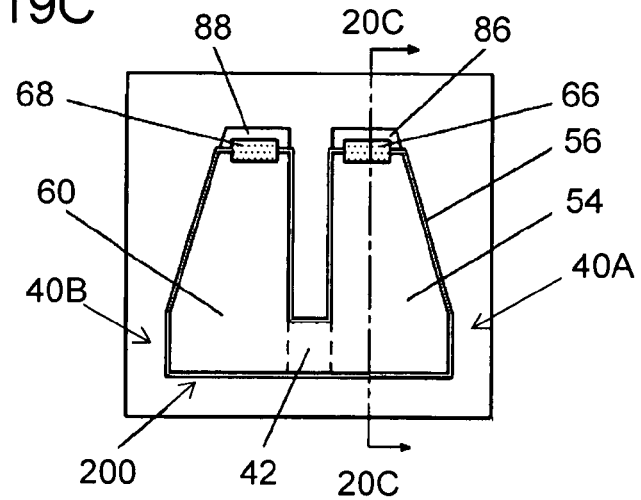
Figure 20A:
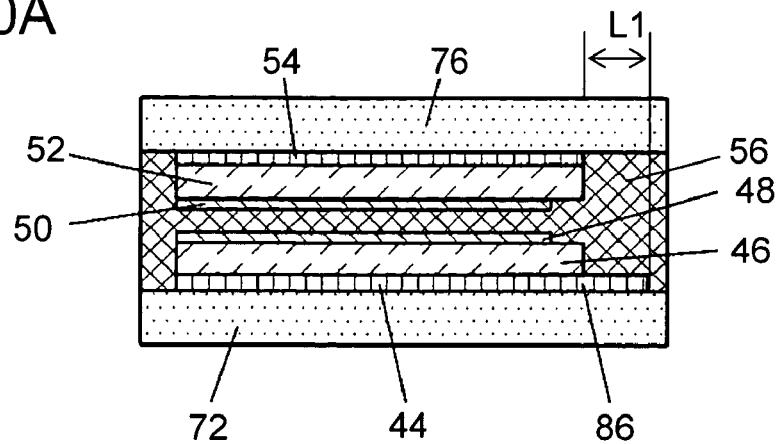
FIG. 20A to FIG. 20C are sectional views along lines 20A—20A, 20B—20B and 20C—20C of FIG. 19A to FIG. 19C, respectively, in the manufacturing method of the thin film piezoelectric element of the third exemplary embodiment.
Figure 20B:
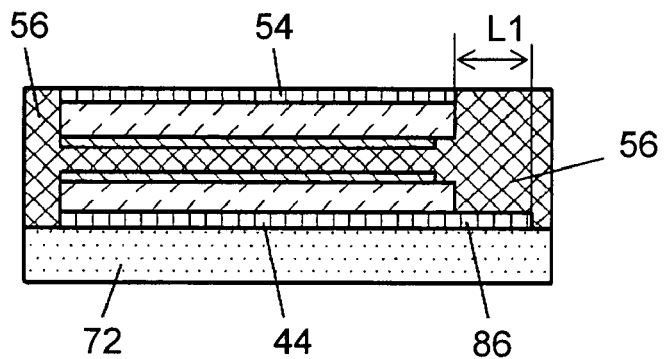
Figure 20C:
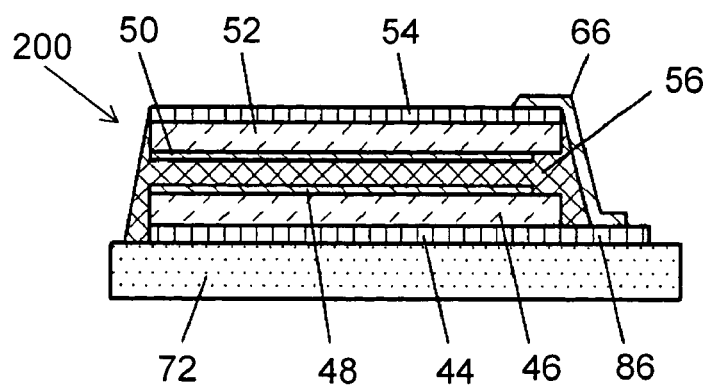

Referring next to FIG. 19A to FIG. 19C and FIG. 20A to FIG. 20C, this is to explain the process of forming a thin film piezoelectric element by bonding a pattern formed on a first substrate 72 with a pattern formed on a second substrate 76. FIG. 19A to FIG. 19C are plan views for explaining this process, and FIG. 20A to FIG. 20C are sectional views along lines 20A—20A, 20B—20B and 20C—20C of FIG. 19A to FIG. 19C, respectively.

FIG. 19A and FIG. 20A show the process of adhering and fixing a first counter electrode film 48 and a second counter electrode film 50, face to face, by means of an insulating adhesive layer 56. The length of the first principal electrode film 44 of the first substrate 72 is extended by the distance L1 from the end of the first piezoelectric thin film 46, principal electrode film 54, and second piezoelectric thin film 52, and a protrusion 86 is formed.

As shown in FIG. 19B and FIG. 20B, the second substrate 76 is removed in the same manufacturing method as in the first exemplary embodiment. As a result, the basic structure of the thin film piezoelectric element is exposed, which includes the first structure 40A composed by laminating the second principal electrode film 54, second piezoelectric thin film 52, second counter electrode film 50, insulating adhesive layer 56, first counter electrode film 48, first piezoelectric thin film 46, and first principal electrode film 44, the second structure 40B of similar laminated structure, and the bonding-region 42 for coupling them. An insulating adhesive layer 56 is also formed on the entire circumference of the first structure 40A and second structure 40B.

As shown in FIG. 19C and FIG. 20C, the insulating adhesive layer 56 is processed by photolithography and etching so as to have overall dimensions slightly larger than the overall dimensions of the first structure 40A and second structure 40B. At the leading end of each structure, at this time, the side surfaces of the first counter electrode film 48 and second counter electrode film 50 are covered with the first piezoelectric thin film 46, second piezoelectric thin film 52, and insulating adhesive layer 56, and insulated. The protrusions 86, 88 of the first principal electrode films 44, 58 are processed by photolithography and etching so as to be exposed.

Similarly, by the film forming method using the mask, conductor films are formed between the protrusion 86 of the first principal electrode film 44 and the second principal electrode film 54 at the leading end of the first structure 40A, and between the protrusion 88 of the first principal electrode film 58 and the second principal electrode film 60 at the leading end of the first structure 40B, and wiring connection parts 66, 68 are fabricated.

In this way, a thin film piezoelectric element 200 is fabricated on the first substrate 72. This thin film piezoelectric element 200 is separated from the first substrate 72, and adhered and fixed on the flexure, so that an actuator is fabricated. This process is the same as the manufacturing process of the third exemplary embodiment, and detailed description is omitted.

According to this manufacturing method, an etching process for forming via holes in the piezoelectric thin film is not needed when forming the wiring connection parts. Using this method, the thin film piezoelectric element is easy to manufacture, the processing time is shortened substantially, and a thin film piezoelectric element of high reliability is obtained. The piezoelectric thin film and electrode film are formed by the film forming method using the mask, and processing by photolithography and etching is conducted only on the adhesive layer, and hence the process is dramatically simplified and the yield is improved.

Figure 21A:
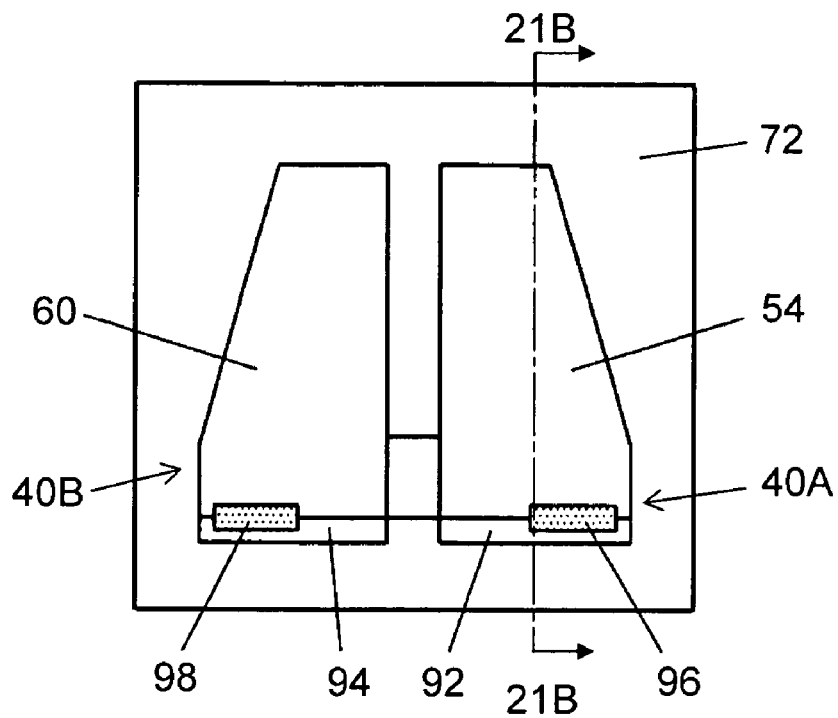
FIG. 21A is a plan view of a modified example of the thin film piezoelectric element of the third exemplary embodiment.
Figure 21B:
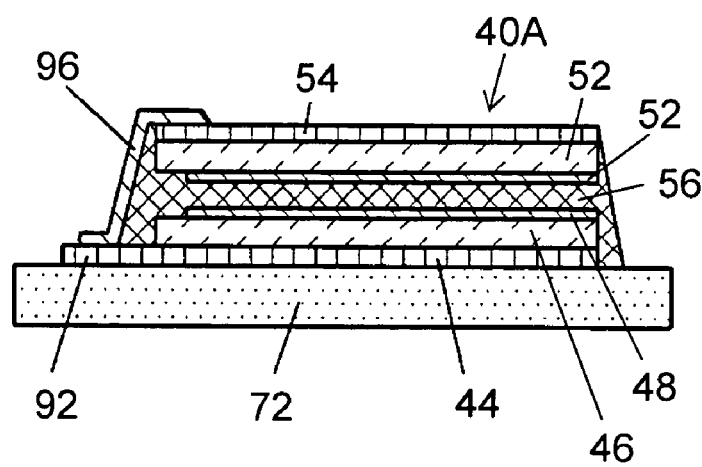
FIG. 21B is a sectional view along line 21B—21B of FIG. 21A.
Figure 22:
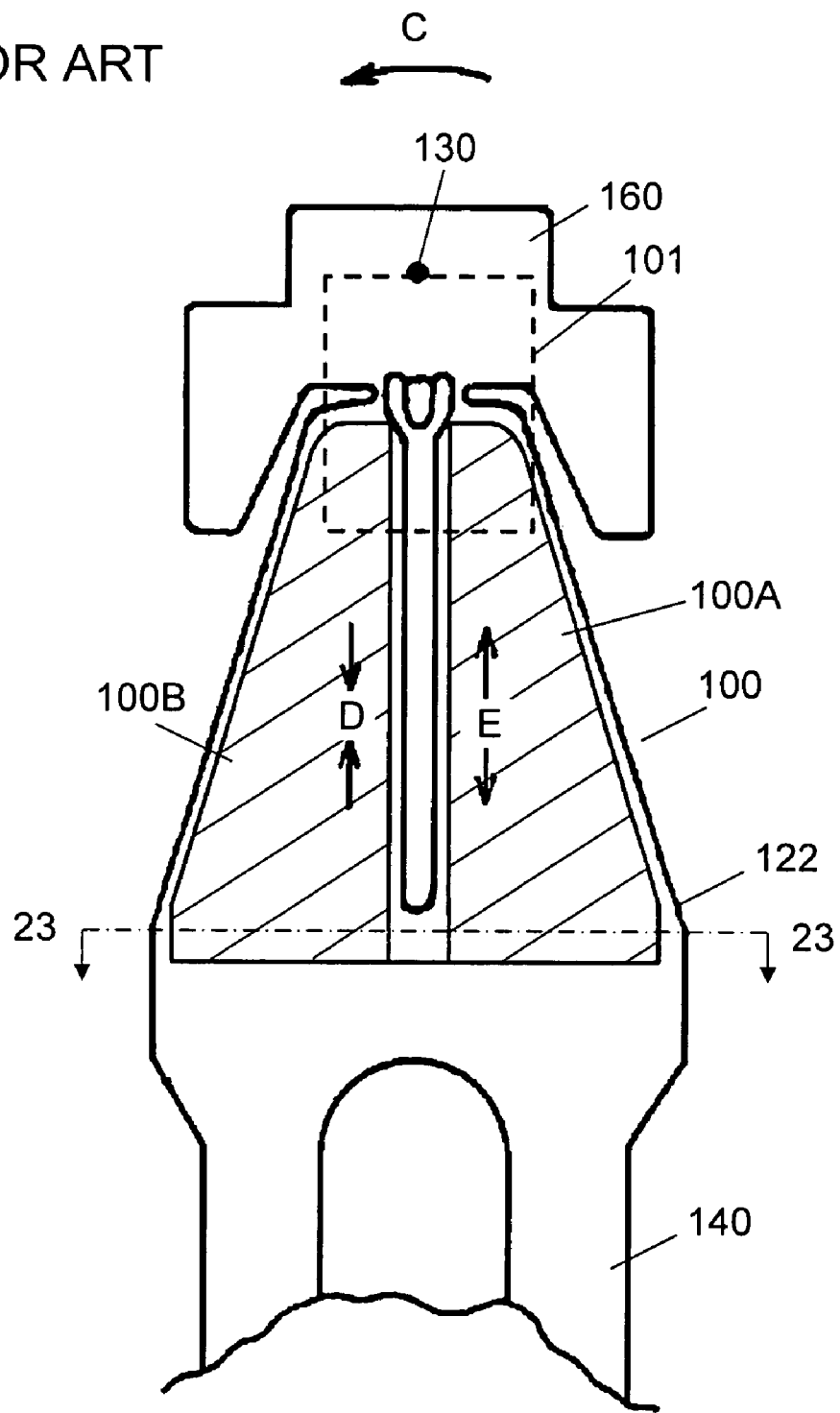
FIG. 22 is a plan view showing an example of a conventional piggyback actuator used in a disk device.
Figure 23:
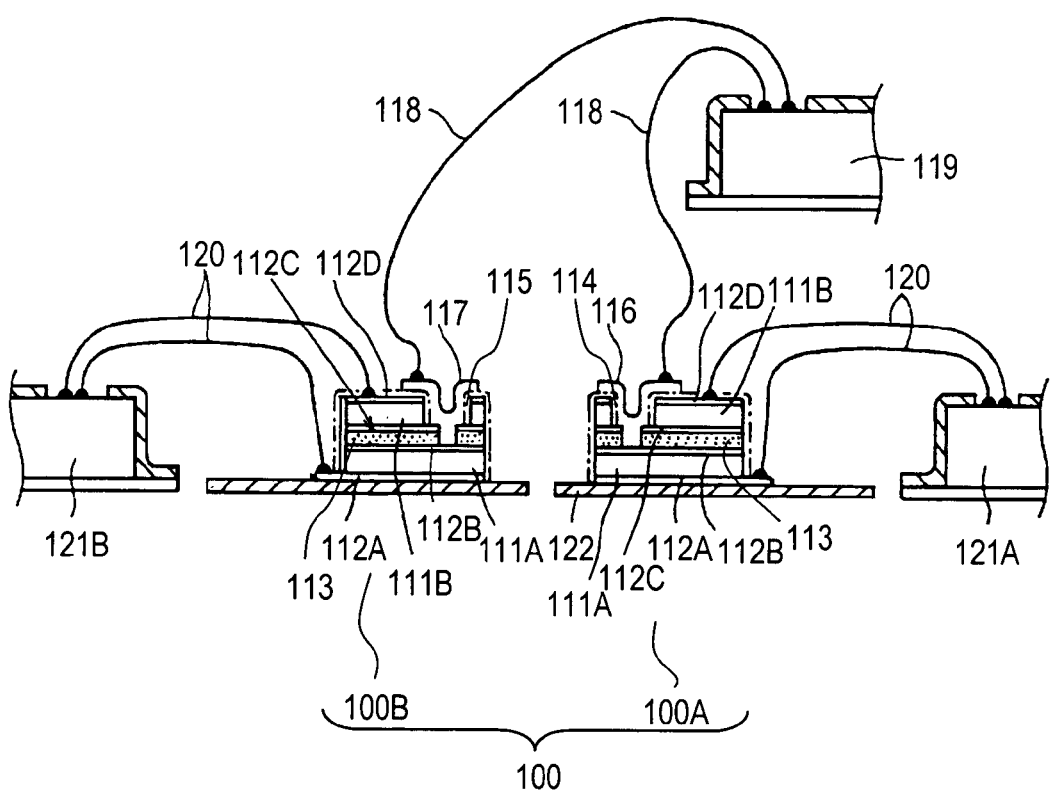
FIG. 23 is a sectional view of an actuator portion composed of the thin film piezoelectric element along line 23—23 of FIG. 22.

In the exemplary embodiments of the invention, the wiring connection parts 66, 68 are provided at the leading end of the first structure 40A and second structure 40B, but the invention is not limited to this configuration alone. For example, FIG. 21A is a plan view of a modified example of a thin film piezoelectric element 250 having wiring connection parts 96, 98 provided at rear edges by the same manufacturing method as the manufacturing method described above, and FIG. 21B is a sectional view along line 21B—21B of FIG. 21A. As shown in FIG. 21A and FIG. 21B, on the first substrate 72, at the rear edges of the first structure 40A and second structure 40B, protrusions 92,94 are formed on the first principal electrode films 44, 58. Consequently, conductor films are formed between the protrusion 92 of the first principal electrode film 44 and the second principal electrode film 54, and between the protrusion 94 of the first principal electrode film 58 and the second principal electrode film 60, and thereby wiring connection parts 96, 98 are composed.

In this configuration, since the wiring connection parts can be formed at positions so as to have no effect on the piezoelectric motion, and therefore the piezoelectric motion is not lowered due to formation of wiring connection parts, that thin film piezoelectric elements capable of large displacement can be mass produced efficiently.

In the second exemplary embodiment and third exemplary embodiment, the wiring connection parts are provided at the leading ends or rear edges, but the invention is not limited to these examples, and they can be formed at side surfaces or other regions of the structures, or any region as long as the displacement of each structure is not disturbed.

In the second exemplary embodiment and third exemplary embodiment, an insulating adhesive layer is used for adhering and fixing the first counter electrode film and second counter electrode film, but the invention is not limited to this example. For example, the counter electrode films can be connected by a conductive adhesive layer, soldering, or eutectic connection with gold (Au) and tin (Sn), and then an insulating coating film is formed on the outer circumference of the first structure and second structure, and therefore a short-circuit with the counter electrode film can be prevented even if the wiring connection parts are formed for connecting the first principal electrode film and second principal electrode film by the conductive film.

Further, in the second exemplary embodiment and third exemplary embodiment, the thin film piezoelectric element is directly connected to the piezoelectric electrode pads 6, 8 on the flexure by means of the conductive adhesive layer, but the invention is not limited to this example alone. For example, an external connection terminal is provided on the second principal electrode film surface of the thin film piezoelectric element, and connected by a wire lead.

In the exemplary embodiments, applications as the actuator 26 of a disk device are explained, but the invention is not limited to such applications alone. That is, it can be applied in a magneto-optical disk device, an optical disk device, or other disk recording and reproducing devices. It can be also used as an actuator required to have an inching function in the horizontal direction.

In the exemplary embodiments, at the bonding-region of the first piezoelectric element unit and second piezoelectric element unit, the first piezoelectric thin film and second piezoelectric thin film are integrally coupled. But these piezoelectric thin films are not required to be provided in this bonding-region, as long as the first counter electrode film and second counter electrode film are commonly coupled electrically with the first piezoelectric element unit and second piezoelectric element unit.

The substrates, piezoelectric thin films, principal electrode films and counter electrode films used in the exemplary embodiments are not limited to the materials and manufacturing methods explained in the exemplary embodiments. Piezoelectric thin films having excellent piezoelectric characteristics can be manufactured, for example, by using magnesium oxide single crystal substrates (MgO substrates) as the substrates, forming a c-axis oriented platinum (Pt) films as principal electrode films on the MgO substrates by sputtering, and forming piezoelectric lead zirconate titanate (PZT) films on the Pt films by sputtering. When forming the PZT films, by forming the films by heating the MgO substrates to temperatures of about 600° C., PZT films polarized and oriented in the direction perpendicular to the film surfaces are obtained.

The substrates are not limited to MgO substrates, but various substrates can be used, such as strontium titanate substrates, sapphire substrates, and silicon single crystal substrates (Si substrates). The principal electrode films are not limited to the Pt films, but other films may be used, such as gold (Au), iridium (Ir), rhodium (Rd), ruthenium (Ru), silver (Ag), rhenium (Re), and palladium (Pd), and these metals or their oxides can be used. The piezoelectric thin films are not limited to PZT, and lead lanthanum titanate zirconate (PLZT), barium titanate and others may be used.

As the counter electrode films, metal single layer films or alloy films can be used as long as the conductivity is excellent and selective etching is possible. On these materials, Au, Ag, Cu or others may be laminated to compose multilayer structures.

What is claimed is:

1. A thin film piezoelectric element comprising:
    a pair of piezoelectric element units including a first piezoelectric element unit and a second piezoelectric element unit;

wherein said first piezoelectric element unit includes a first structure, and said second piezoelectric element unit includes a second structure;

wherein each of said first and second structures comprises a first piezoelectric thin film enclosed between a first principal electrode film and a first counter electrode film, and a second piezoelectric thin film enclosed between a second principal electrode film and a second counter electrode film, said first counter electrode film and said second counter electrode film being bonded together so as to face each other via an adhesive layer;

wherein said first structure and said second structure are disposed on substantially a same plane;

wherein said first and second structures are generally separate from each other but are coupled together at a bonding-region, said first and second counter electrode films of said first structure being coupled to said first and second counter electrode films of said second structure, respectively, at said bonding-region;

wherein said first piezoelectric element unit includes a wiring connection part connecting said first principal electrode film of said first structure with said second principal electrode film of said first structure, and said second piezoelectric element unit includes a wiring connection part connecting said first principal electrode film of said second structure with said second principal electrode film of said second structure;

wherein, at said bonding-region, said first counter electrode film of said first structure is integrally formed with said first counter electrode film of said second structure; and wherein, at said bonding region, said second counter electrode film of said first structure is integrally formed with said second counter electrode film of said second structure.

2. The thin film piezoelectric element of claim 1, wherein said first piezoelectric thin film of said first structure is coupled with said first piezoelectric thin film of said second structure at said bonding-region; and said second piezoelectric thin film of said first structure is coupled with said second piezoelectric thin film of said second structure at said bonding-region.

3. The thin film piezoelectric element of claim 1, wherein an external connection terminal of said first piezoelectric element unit is provided on one of said first principal electrode film and said second principal electrode film of said first structure; and an external connection terminal of said second piezoelectric element unit is provided on one of said first principal electrode film and said second principal electrode film of said second structure.

4. A thin film piezoelectric element comprising:

a pair of piezoelectric element units including a first piezoelectric element unit and a second piezoelectric element unit;

wherein said first piezoelectric element unit includes a first structure, and said second piezoelectric element unit includes a second structure;

wherein each of said first and second structures comprises a first piezoelectric thin film enclosed between a first principal electrode film and a first counter electrode film, and a second piezoelectric thin film enclosed between a second principal electrode film and a second counter electrode film, said first counter electrode film and said second counter electrode film being bonded together so as to face each other via an adhesive layer;

wherein said first structure and said second structure are disposed on substantially a same plane;

wherein said first and second structures are generally separate from each other but are coupled together at a bonding-region, said first and second counter electrode films of said first structure being coupled to said first and second counter electrode films of said second structure, respectively, at said bonding-region;

wherein said first piezoelectric element unit includes a wiring connection part connecting said first principal electrode film of said first structure with said second principal electrode film of said first structure, and said second piezoelectric element unit includes a wiring connection part connecting said first principal electrode film of said second structure with said second principal electrode film of said second structure;

wherein said first piezoelectric thin film of said first structure is integrally formed with said first piezoelectric thin film of said second structure at said bonding-region; and wherein said second piezoelectric thin film of said first structure is integrally formed with said second piezoelectric thin film of said second structure at said bonding-region.

5. The thin film piezoelectric element of claim 4, wherein an external connection terminal of said first piezoelectric element unit is provided on one of said first principal electrode film and said second principal electrode film of said first structure; and an external connection terminal of said second piezoelectric element unit is provided on one of said first principal electrode film and said second principal electrode film of said second structure.

6. A thin film piezoelectric element comprising:

a pair of piezoelectric element units including a first piezoelectric element unit and a second piezoelectric element unit;

wherein said first piezoelectric element unit includes a first structure, and said second piezoelectric element unit includes a second structure;

wherein each of said first and second structures comprises a first piezoelectric thin film enclosed between a first principal electrode film and a first counter electrode film, and a second piezoelectric thin film enclosed between a second principal electrode film and a second counter electrode film, said first counter electrode film and said second counter electrode film being bonded together so as to face each other via an adhesive layer;

wherein said first structure and said second structure are disposed on substantially a same plane;

wherein said first and second structures are generally separate from each other but are coupled together at a bonding-region, said first and second counter electrode films of said first structure being coupled to said first and second counter electrode films of said second structure, respectively, at said bonding-region;

wherein said first piezoelectric element unit includes a wiring connection part connecting said first principal electrode film of said first structure with said second principal electrode film of said first structure, and said second piezoelectric element unit includes a wiring connection part connecting said first principal electrode film of said second structure with said second principal electrode film of said second structure;

wherein said wiring connection parts of said first and second piezoelectric element units, respectively, are formed adjacent leading ends or rear edges of said first and second structures, respectively;

wherein said first principal electrode films of said first and second structures have projection portions exposed from said first and second structures, respectively, adjacent the leading ends or rear edges of said first and second structures, respectively; and wherein said wiring connection parts are electrically connected to said protrusion portions of said first and second principal electrode films by conductor films formed on outer circumferences of said first and second structures, respectively.

7. The thin film piezoelectric element of claim 6, wherein an external connection terminal of said first piezoelectric element unit is provided on one of said first principal electrode film and said second principal electrode film of said first structure; and an external connection terminal of said second piezoelectric element unit is provided on one of said first principal electrode film and said second principal electrode film of said second structure.

8. An actuator comprising:

a holding substrate having a terminal electrode; and a thin film piezoelectric element mounted to said holding substrate, said thin film piezoelectric element comprising first and second piezoelectric element units disposed mirror symmetrically with respect to a center line on said holding substrate and spaced apart at a specific interval;

wherein said first and second piezoelectric element units are arranged to be operable to expand and contract in mutually opposite directions via piezoelectric motion and cause an element mounted on said holding substrate to be moved in a direction generally perpendicular to said mutually opposite directions;

wherein said first piezoelectric element unit includes a first structure, and said second piezoelectric element unit includes a second structure;

wherein each of said first and second structures comprises a first piezoelectric thin film enclosed between a first principal electrode film and a first counter electrode film, and a second piezoelectric thin film enclosed between a second principal electrode film and a second counter electrode film, said first counter electrode film and said second counter electrode film being bonded together so as to face each other via an adhesive layer;

wherein said first structure and said second structure are disposed on substantially a same plane;

wherein said first and second structures are generally separate from each other but are coupled together at a bonding-region, said first and second counter electrode films of said first structure being coupled to said first and second counter electrode films of said second structure, respectively, at said bonding-region;

wherein said first piezoelectric element unit includes a wiring connection part connecting said first principal electrode film of said first structure with said second principal electrode film of said first structure, and said second piezoelectric element unit includes a wiring connection part connecting said first principal electrode film of said second structure with said second principal electrode film of said second structure;

wherein said wiring connection parts of said first and second piezoelectric element units and said terminal electrode of said holding substrate are connected so as to conduct with each other.

9. A head support mechanism comprising:

a head for performing at least one of recording and reproducing;

a head slider on which said head is mounted; and an actuator according to claim 8 mounted adjacent to said head slider and formed of a thin film piezoelectric element fixed on said holding substrate, wherein said holding substrate constitutes a flexure;

wherein said head slider is fitted to said flexure; and wherein the element movable in a direction generally perpendicular to said mutually opposite directions is constituted by said head.

10. A disk recording and reproducing device comprising:

a disk;

a head slider;

a head mounted on said head slider;

an arm supporting said head slider; and first and second positioning devices arranged for positioning said head slider at a predetermined track position of said disk;

wherein said first positioning device comprises a rotary driving unit for rotating said arm;

wherein said second positioning device comprises an actuator according to claim 8;

wherein said holding substrate comprises a flexure and said flexure is fixed to said arm; and wherein the element that is caused, by the expansion and contraction of said first and second piezoelectric element units in mutually opposite directions, to be moved in the direction generally perpendicular to said mutually opposite directions is constituted by said head, such that operation of said actuator moves said head slightly to a predetermined track position of said disk.

11. The disk recording and reproducing device of claim 10, wherein said disk comprises a hard disk for a magnetic recording and reproducing device; and said head comprises a magnetic head.

12. A method of manufacturing a thin film piezoelectric element, comprising:

laminating a first principal electrode film, a first piezoelectric thin film and a first counter electrode film sequentially on a first substrate;

laminating a second principal electrode film, a second piezoelectric thin film and a second counter electrode film sequentially on a second substrate;

fixing the first counter electrode film and the second counter electrode thin film to face each other via an adhesive layer;

removing only the second substrate;

processing the first principal electrode film, the first piezoelectric thin film, the first counter electrode film, the second counter electrode film, the second piezoelectric thin film, the second principal electrode film, and the adhesive layer into specified shapes for forming first and second structures that are mirror symmetrical with respect to a center line and are spaced apart by a specific interval in a region for allowing piezoelectric motion, and for forming a bonding-region of partially mutually integral structure of said first and second structures;

removing the second principal electrode film at the bonding-region;

coating said first and second structures with a resin layer, and bonding a temporary fixing substrate thereto via an adhesive;

removing only the first substrate so as to expose the first principal electrode film at the bonding-region;

removing the first principal electrode film at the bonding-region; and separating the temporary fixing substrate by lowering adhesion of the adhesive used for bonding the temporary fixing substrate.

13. A method of manufacturing a thin film piezoelectric element, comprising:

forming a first principal electrode film having a slit of a specified width on a first substrate by using a specified mask, and laminating a first piezoelectric thin film and a first counter electrode film sequentially;

forming a second principal electrode film on a second substrate by using a mask of same shape as the mask used for forming the first principal electrode film, and laminating a second piezoelectric thin film and a second counter electrode film sequentially;

fixing the first counter electrode film and the second counter electrode film via an adhesive layer, so that the slit of the first principal electrode film and the slit of the second principal electrode film substantially coincide with each other;

removing only the second substrate;

processing the first principal electrode film, the first piezoelectric thin film, the first counter electrode film, the second counter electrode film, the second piezoelectric thin film, the second principal electrode film and the adhesive layer into specified shapes for forming first and second structures that are mirror symmetrical with respect to a center line of the slit in a region for allowing piezoelectric motion, so that a bonding-region of partially mutually integral structure of said first and second structures is positioned on an extension line of said slit;

coating the pair of structures with a resin layer, and bonding a temporary fixing substrate thereto via an adhesive;

removing only the first substrate; and separating the temporary fixing substrate by lowering adhesion of the adhesive used for bonding the temporary fixing substrate.

14. A method of manufacturing a thin film piezoelectric element, comprising:

forming, on a first substrate, a first principal electrode film having a slit of a specified width;

forming a first piezoelectric thin film on the first principal electrode film and in the slit;

forming a first counter electrode film on the first piezoelectric thin film so as to leave a specified region of the first piezoelectric thin film uncovered by the first counter electrode film, said specified region having a specified width and extending in a direction orthogonal to the slit;

forming, on a second substrate, a second principal electrode film having a slit of a same width as the slit of the first principal electrode film;

laminating a second piezoelectric thin film in a same shape as the first piezoelectric thin film and a second counter electrode film in a same shape as the first counter electrode film;

fixing the first counter electrode film and the second counter electrode film via an adhesive layer, so that the slit of the first principal electrode film and the slit of the second principal electrode film substantially coincide with each other;

removing only the second substrate;

processing the first principal electrode film, the first piezoelectric thin film, the first counter electrode film, the second counter electrode film, the second piezoelectric thin film, the second principal electrode film and the adhesive layer on the first substrate for forming first and second structures that are mirror symmetrical with respect to a center line of said slits to allow for piezo electric motion, so that a bonding-region of partially mutually integral structure of said first and second structures is positioned on an extension line of said slit, and forming protrusions exposed from said first and second the structures in part of each first principal electrode film of said first and second structures; and forming wiring connection parts for connecting the protrusions of the first principal electrode with the second principal electrode of each of said first and second structures.

15. A method of manufacturing a thin film piezoelectric element, comprising:

forming a pair of first principal electrode films of specified shapes that are mirror symmetrical with respect to a first slit extending in a first direction;

forming a substantially U-shaped first piezoelectric thin film on the pair of first principal electrode films and in part of said first slit, said first piezoelectric thin film having a smaller length in said first direction than the first principal electrode films so as to leave specified regions of the first principal electrode films uncovered by the first piezoelectric thin film, said specified regions being located at one end and extending in a second direction orthogonal to said first direction;

forming a first counter electrode film having a smaller length in said first direction than the first piezoelectric thin film so as to leave a region of said first piezoelectric thin film uncovered by said first counter electrode film only at the one end;

forming a pair of second principal electrode films that are mirror symmetrical with respect to a second slit extending in a third direction, said second principal electrode films having a smaller length in said third direction than the first principal electrode films have in said first direction, said second slit having a same width as said first slit;

forming a substantially U-shaped second piezoelectric thin film on the pair of second principal electrode films and in part of the second slit;

forming a second counter electrode film having a smaller length in said third direction than the second piezoelectric thin film only so as to leave a region of said second piezoelectric thin film uncovered by said second counter electrode film at the one end;

fixing the first counter electrode film to the second counter electrode film via an adhesive layer, so that the first slit of the first principal electrode film and the second slit of the second principal electrode film substantially coincide with each other;

removing the second substrate;
processing the adhesive layer on the first substrate by photolithography and etching for forming first and second structures that are mirror symmetrical with respect a center line of the first and second slits to allow for piezoelectric motion, so that a bonding-region of partially mutually integral structure of said first and second structures is positioned on an extension line of said slits, and for forming protrusions exposed from the first and second structures in part of the first principal electrode film of each of the first and second structures; and forming wiring connection parts for connecting the protrusions of the first principal electrode with the second principal electrode for each of the first and second structures.

* * * * *

UNITED STATES PATENT AND TRADEMARK OFFICE
CERTIFICATE OF CORRECTION

PATENT NO. : 7,068,474 B2  Page 1 of 1
APPLICATION NO. : 10/725627
DATED : June 27, 2006
INVENTOR(S) : Hideki Kuwajima et al.

It is certified that error appears in the above-identified patent and that said Letters Patent is hereby corrected as shown below:

In column 24, line 12, please replace "piezo electric" with --piezoelectric--.

Signed and Sealed this

Twenty-third Day of January, 2007

JON W. DUDAS
*Director of the United States Patent and Trademark Office*